United States Patent
Chiang et al.

(10) Patent No.: US 10,639,833 B2
(45) Date of Patent: May 5, 2020

(54) MOLDING SYSTEM WITH MOVABLE MOLD TOOL

(71) Applicant: Infineon Technologies AG, Neubiberg (DE)

(72) Inventors: Chau Fatt Chiang, Melaka (MY); Khar Foong Chung, Perak (MY)

(73) Assignee: Infineon Technologies AG, Neubiberg (DE)

( * ) Notice: Subject to any disclaimer, the term of this patent is extended or adjusted under 35 U.S.C. 154(b) by 30 days.

(21) Appl. No.: 15/472,721

(22) Filed: Mar. 29, 2017

(65) Prior Publication Data

US 2017/0282426 A1 Oct. 5, 2017

(30) Foreign Application Priority Data

Mar. 30, 2016 (DE) ........................ 10 2016 105 761

(51) Int. Cl.
| | |
|---|---|
| *H01L 21/56* | (2006.01) |
| *B29C 45/17* | (2006.01) |
| *B29C 45/02* | (2006.01) |
| *B29C 45/14* | (2006.01) |
| *B29C 45/16* | (2006.01) |
| *H01L 21/67* | (2006.01) |
| *B29K 105/00* | (2006.01) |
| *B29L 31/34* | (2006.01) |

(52) U.S. Cl.
CPC .......... *B29C 45/1756* (2013.01); *B29C 45/02* (2013.01); *B29C 45/14336* (2013.01); *B29C 45/1671* (2013.01); *H01L 21/565* (2013.01); *H01L 21/67126* (2013.01); *B29C 45/1635* (2013.01); *B29K 2105/0058* (2013.01); *B29L 2031/3481* (2013.01); *H01L 2224/32014* (2013.01); *H01L 2224/48091* (2013.01); *H01L 2224/48247* (2013.01); *H01L 2224/73265* (2013.01)

(58) Field of Classification Search
CPC .................................................. B29C 45/1756
See application file for complete search history.

(56) References Cited

U.S. PATENT DOCUMENTS

| | | | |
|---|---|---|---|
| 4,726,758 A | 2/1988 | Sekine et al. | |
| 6,117,382 A * | 9/2000 | Thummel | B29C 45/14655 257/E21.504 |
| 9,202,770 B1 * | 12/2015 | Foong | H01L 23/3675 |
| 2002/0102320 A1 * | 8/2002 | Hahn | B29C 45/16 425/190 |
| 2008/0254575 A1 * | 10/2008 | Fuergut | H01L 21/561 438/127 |
| 2011/0235974 A1 | 9/2011 | Tay et al. | |
| 2014/0021491 A1 | 1/2014 | Meng et al. | |

* cited by examiner

Primary Examiner — Mohammad M Choudhry

(57) ABSTRACT

An apparatus for molding a physical body comprising at least two mold materials, wherein the apparatus comprises a first mold tool and a second mold tool configured for defining a mold volume in between in which the physical body is moldable by supplying the at least two mold materials, and a supply unit configured for separately supplying the at least two mold materials to the mold volume, wherein at least part of at least one of the first mold tool and the second mold tool is movable to thereby increase the dimension of the mold volume after having supplied the first mold material to the mold volume and before and/or during supplying the second mold material to the mold volume.

18 Claims, 18 Drawing Sheets

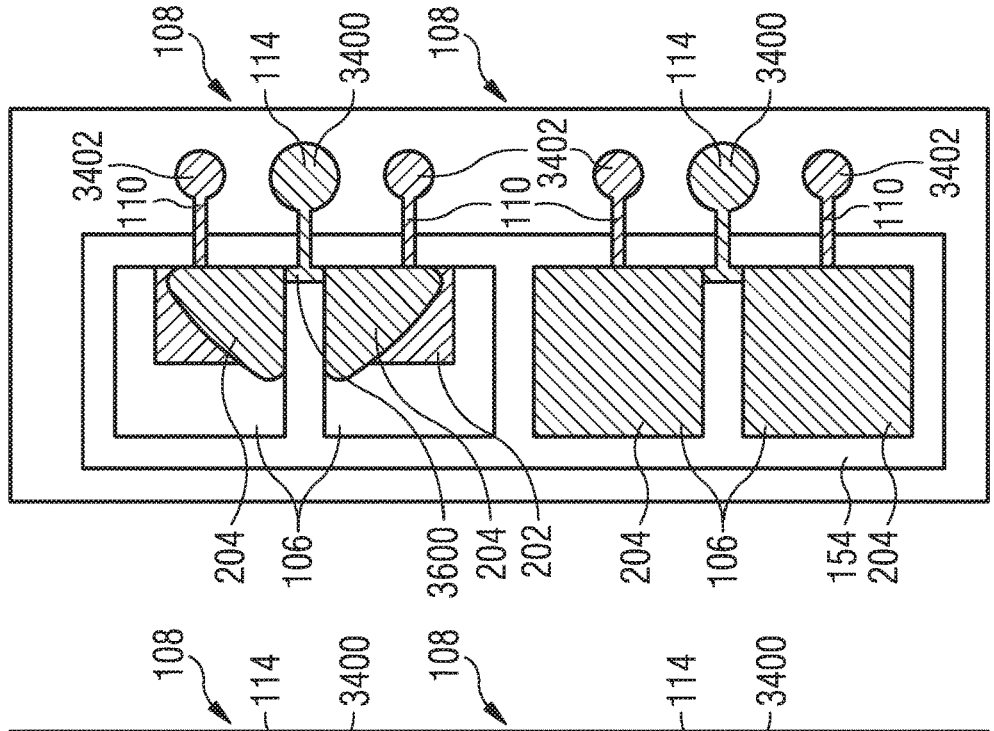
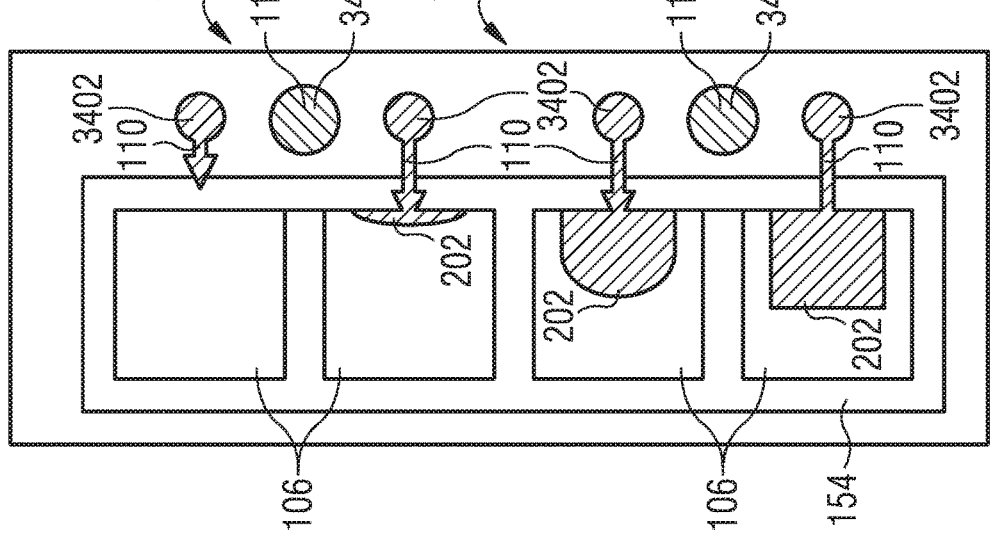
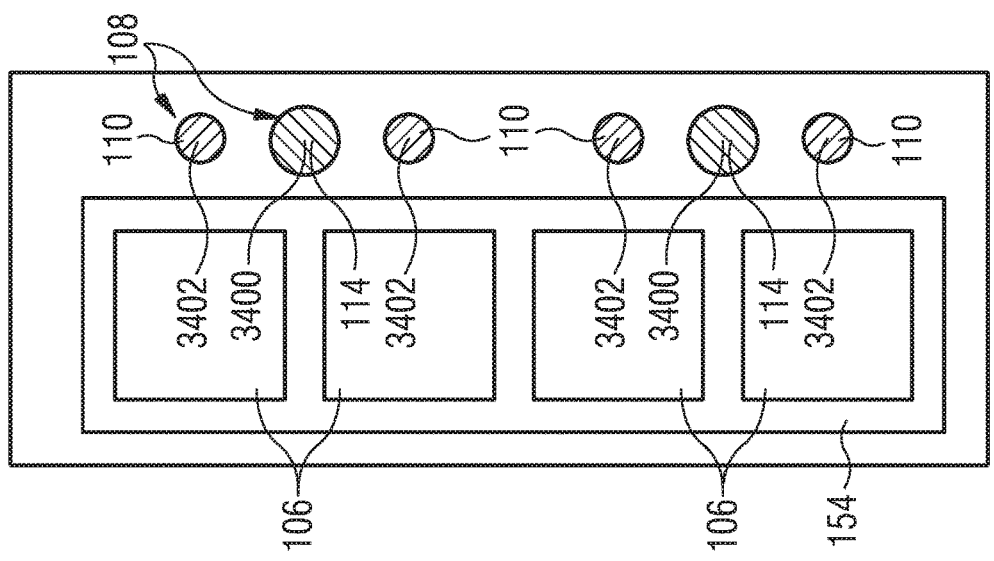

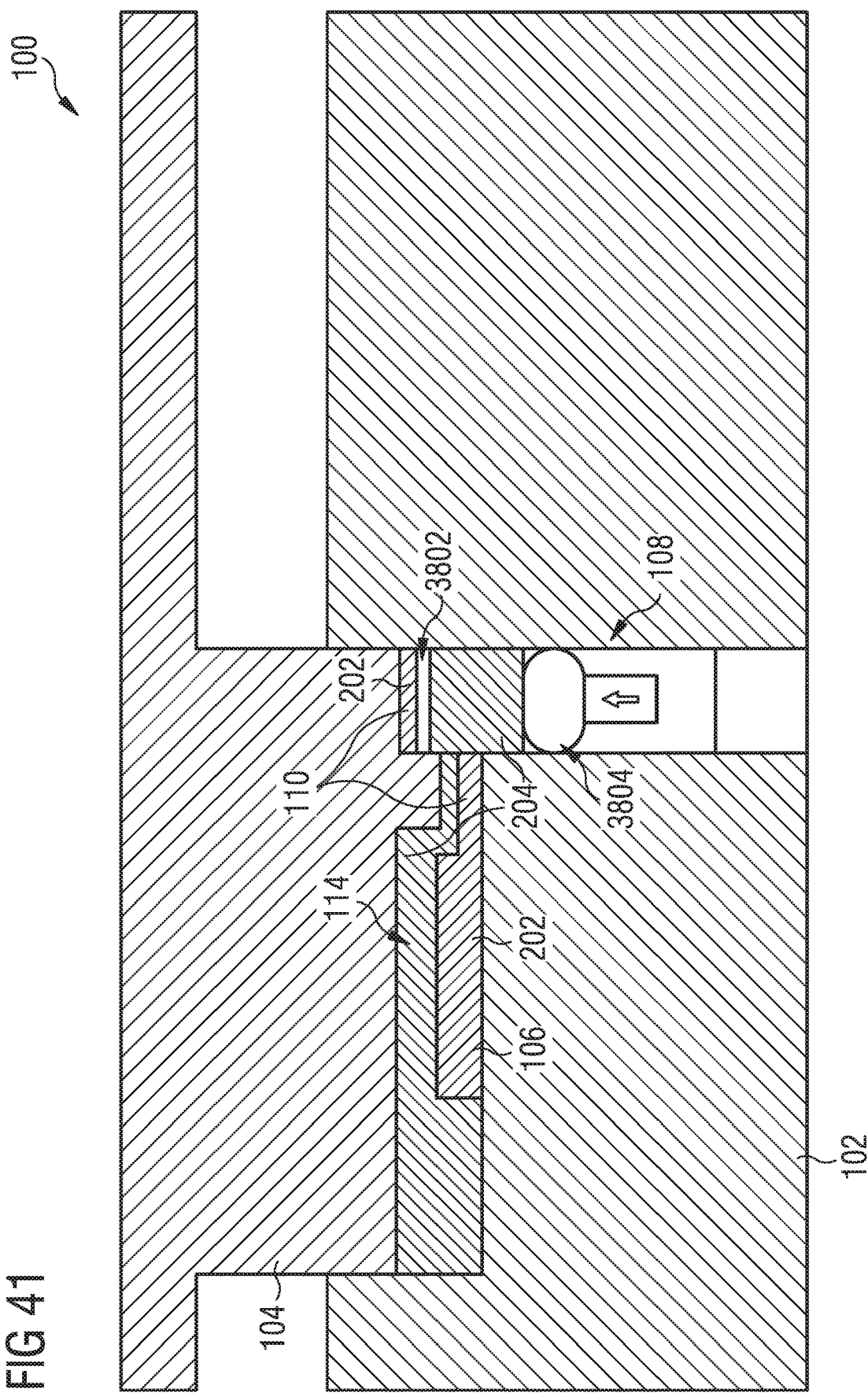

MOLDING SYSTEM WITH MOVABLE MOLD TOOL

BACKGROUND OF THE INVENTION

Field of the Invention

The present invention relates to apparatuses for and methods of molding a physical body.

Description of the Related Art

Packages may be denoted as encapsulated electronic chips with electrical connects extending out of the encapsulant and being mounted to an electronic periphery, for instance on a printed circuit board.

Packaging cost is an important driver for the industry. Related with this are performance, dimensions and reliability. The different packaging solutions are manifold and have to address the needs of the application. There are applications, where high performance is required, others, where reliability is the top priority—but all requires lowest possible cost.

One technology used for manufacturing packages is molding for manufacturing an encapsulant for encapsulating an electronic chip of the package.

SUMMARY OF THE INVENTION

There may be a need to enable molding in a flexible and efficient way, in particular for manufacturing packages in a simple and reliable manner.

According to an exemplary embodiment, an apparatus for molding a physical body comprising at least two different mold materials (such as mold compounds) is provided, wherein the apparatus comprises a first mold tool and a second mold tool configured for defining a mold volume in between in which the physical body is moldable by supplying the at least two mold materials, and a supply unit configured for separately supplying the at least two mold materials to the mold volume, wherein at least part of at least one of the first mold tool and the second mold tool is movable (in particular during the molding procedure) to thereby increase the dimension of the mold volume after having supplied the first mold material to the mold volume and before and/or during supplying the second mold material to the mold volume.

According to another exemplary embodiment, an apparatus for molding a physical body comprising a mold material is provided, wherein the apparatus comprises a first mold tool and a second mold tool configured for defining a mold volume in their interior in which the physical body is moldable by supplying the mold material, and a supply unit configured for supplying the mold material to the mold volume, wherein at least part of the first mold tool and at least part of the second mold tool are movable relative to one another to thereby adjust (for instance increase or decrease) the dimension of the mold volume.

According to still another exemplary embodiment, a method of manufacturing a physical body comprising at least two mold materials by molding is provided, wherein the method comprises defining an initial mold volume between a first mold tool and a second mold tool, supplying a first mold material to the initial mold volume, subsequently moving at least part of at least one of the first mold tool and the second mold tool to thereby change the dimension of the mold volume compared to the initial mold volume, and supplying the second mold material to the mold volume with the changed dimension during and/or after the moving.

According to yet another exemplary embodiment, a method of manufacturing a physical body comprising a mold material by molding is provided, wherein the method comprises providing a first mold tool and a second mold tool configured for defining a mold volume in which the physical body is moldable by supplying the mold material, moving at least part of at least one of the first mold tool and the second mold tool to thereby adjust the dimension of the mold volume, and supplying the mold material to the mold volume with the adjusted dimension of the mold volume.

According to one exemplary embodiment of the invention, molding is enabled with a first molding tool and a cooperating second molding tool being configured to be movable relative to one another prior or during the molding to thereby make it possible to flexibly define the dimension of the mold volume enclosed between the two molding tools, for instance depending on a molding application or user preferences. This makes it possible to use one and the same mold machine composed of the two molding tools for manufacturing a molded body with adjustable shape and/or dimension.

According to another exemplary embodiment of the invention, two mutually movable molding tools are configured to cooperate with one another and with a supply unit for manufacturing a molded body composed of two or more different mold materials. In a first orientation of the molding tools relative to one another corresponding to a first mold volume, a first mold material may be supplied to the supply unit to form a first portion of the molded body to be formed. After that, the mold tools may be moved relative to one another to increase the mold volume from the first mold volume to a larger second mold volume. In this second orientation of the molding tools relative to one another corresponding to the second mold volume, a further (in particular another) mold material may be supplied to the supply unit to form a second portion of the molded body on the first portion. This allows to manufacture molded bodies or packages with different mold materials having different physical properties (such as electrically insulating-thermally conductive, optically transparent-opaque, magnetic-nonmagnetic, etc.).

DESCRIPTION OF FURTHER EXEMPLARY EMBODIMENTS

In the following, further exemplary embodiments of the apparatus and the method will be explained.

In the context of the present application, the term "package" may particularly denote at least one at least partially encapsulated semiconductor chip with at least one external electric contact. The encapsulation may be at least partially formed by a mold material.

In an embodiment, the first mold tool is stationary and the second mold tool is partially or entirely movable. This keeps the number of movable parts as low as possible, and hence keeps the complexity of the apparatus low. It is however alternatively also possible that both the first molding tool and the second molding tool are movable.

In an embodiment, the first mold tool is a bottom mold tool (for instance to be placed on a ground) and the second mold tool is a top mold tool (for instance located above the bottom mold tool). When the top mold tool is attached to the bottom mold tool, interior recesses of the mold tools form the mold volume in terms of size and shape. When the bottom mold tool is configured stationary and the top mold tool is configured movable, the complexity of the construction of the apparatus can be kept low.

In an embodiment, the mold volume is delimited by a planar boundary surface of the first mold tool and a profiled (for instance at least partially convex and/or concave) boundary surface of the second mold tool.

In an embodiment, at least one of the first mold tool and the second mold tool is movable to thereby increase the dimension of the mold volume in a stacking (or mounting) direction (in particular exclusively in a stacking direction) of the first mold tool and the second mold tool. In such an embodiment, it is possible to increase the vertical height of the mold volume which equals to the interior volume between the mold tools. The described architecture keeps the constructional effort for the apparatus small.

In an embodiment, the first mold tool and the second mold tool are configured so that despite of the motion, the dimension of the mold volume remains constant in a plane perpendicular to a stacking direction of the first mold tool and the second mold tool. In other words, the lateral extension of the mold volume may remain the same in such an embodiment, even if one of the mold tools is moving with respect to the other one. It is however alternatively also possible that, additionally or alternatively to a size adjustment in a vertical stacking direction, one or more lateral walls of at least one of the mold tools move(s) for adjusting the mold volume.

In an embodiment, the first mold tool and the second mold tool are configured so that the mold volume comprises a plurality of distinct volume sections in fluid communication with one another, wherein a respective physical body is manufacturable in each of the volume sections. After the molding, the physical bodies may still be connected to one another by connection sections (of mold material) such as webs, but may be singularized or separated by disconnecting (for instance by cutting or breaking) the physical bodies at the connection sections. This allows for a batch manufacture of a plurality of molded physical bodies (such as semiconductor packages) at the same time. Therefore, such an embodiment is particularly advantageous for high throughput applications.

In an embodiment, the apparatus is configured for manufacturing a semiconductor package as physical body. Such a semiconductor package may comprise one or more electronic chips (in particular a semiconductor chip with at least one integrated circuit, such as a transistor or a diode, formed in a surface portion therein) encapsulated within a molded encapsulant. The one or more electronic chips may be mounted on a chip carrier such as a lead frame before encapsulation by molding. It is also possible that a chip pad of the electronic chip is electrically connected to the chip carrier, for example by one or more bond wires.

In an embodiment, the supply unit comprises a first supply path configured for supplying the first mold material (in particular from a first reservoir) to the mold volume, and a (partially or entirely) separate second supply path configured for supplying the second mold material (in particular from a second reservoir) to the mold volume with the increased dimension. Such an embodiment is shown in FIG. 34 to FIG. 37. The provision of two separate supply paths for two different mold materials allows for a very precise metering of the amounts of the different mold materials and efficiently prevents an undesired mixture of preforms of the mold materials before molding.

In another embodiment, the supply unit comprises a (partially or entirely) common supply path for supplying the first mold material and the second mold material to the mold volume. Such an embodiment is shown in FIG. 38 to FIG. 41. The provision of a common supply path for two different mold materials allows for a very compact configuration of the apparatus and for a quick molding procedure.

In an embodiment (which may in particular be combined advantageously with the previously described embodiment), the supply unit is configured for simultaneously transporting a first volume of first mold material followed by a second volume of second mold material to the mold volume. For instance, one and the same transport mechanism (for example driven by one or more piston) may move very efficiently both the first mold material and the second mold material in phase.

In an embodiment (which may in particular be combined advantageously with the two previously described embodiments), the supply unit is configured for interposing a dummy spacer between the simultaneously transported first volume of first mold material and second volume of second mold material. Such a dummy spacer may for example be a spacing sheet made from a solid material, for instance a plastic foil or sheet, or may be alternatively a liquid or even gaseous spacer (preferably having properties to resist mixture with and prevent mixture of both the first and the second mold material). Hence, such a dummy spacer advantageously keeps the two different mold materials strictly separated from one another upstream of the mold volume. The dummy spacer may be removed and separated from the mold materials after the latter have reached and have been introduced into the mold volume.

In an embodiment, the supply unit is configured for transporting the dummy spacer continuously along a (for instance straight) first direction, and is configured for transporting the first volume of first mold material and the second volume of second mold material along the first direction until the first mold material and the second mold material reach the mold volume and along another second direction (for instance perpendicular to the first direction) when the first mold material and the second mold material have reached the mold volume. The fluidic (for example liquid) character of the first and second mold materials prior to the respective molding procedure (including curing) has the consequence that the fluidic first and second mold materials, when driven by a transport mechanism such as a piston, automatically move in a sideward direction with regard to a longitudinally oriented piston motion, when the mold volume is located sidewardly. A solid dummy spacer however will follow the transport direction of the transport mechanism (for instance the motion direction of the piston) so that it will be automatically separated from the mold materials at the location of the mold volume. Such a dummy spacer efficiently suppresses an undesired mixture of preforms of the mold materials before molding.

In an embodiment, the supply unit comprises at least one movable plunger (or piston) configured for moving the first mold material and the second mold material. A single plunger operating on both the first mold material and the second mold material provides for a very compact solution.

In another embodiment, the supply unit comprises a plurality of movable plungers (or pistons) each configured for moving a respective one of the first mold material and the second mold material. This simplifies precise metering of different amounts of the first mold material and the second mold material.

In an embodiment, at least part of at least one of the first mold tool and the second mold tool is configured to be further movable to thereby further increase the dimension of the increased mold volume after having supplied the second mold material to the already increased mold volume and before and/or during supplying a third mold material to the further increased mold volume. Thus, the described principle of exemplary embodiments of the invention can also be used for forming molded bodies composed of three or more different mold materials manufactured within one and the same apparatus without removing portions of the molded body before continuing the molding procedure with another mold material.

In an embodiment, the method comprises manufacturing a semiconductor package as the physical body, wherein the semiconductor package comprises at least one semiconductor chip which is at least partially encapsulated by the first mold material which is, in turn, at least partially encapsulated by the second mold material. For instance, such a semiconductor package may be configured as at least one of the group consisting of an optocoupler package and a light-emitting diode package. Other embodiments are however possible as well.

In an embodiment, the first mold material is optically transparent (for instance for allowing a light-emitting diode as electronic chip to exchange electromagnetic radiation, such as light, with the environment) and the second mold material is optically opaque (for instance for preventing light from the LED from propagating into the optically opaque material). More generally, the formation of molded bodies from different mold materials within one and the same apparatus has the advantage that mold materials with at least two different physical properties may be combined. Thus, embodiments of the invention in particular cover also other applications in which one mold material (for instance with thermal functionality, electrical functionality, optical functionality, magnetic functionality, etc.) is to be connected to another mold material (with a respectively other functionality). This particularly holds for a scenario in which two mold materials with different properties are to be combined. Molding twice within one apparatus may thus be carried out for combining two different material properties provided by the first mold material and the second mold material. Examples for the two different material properties are the property pairs "magnetic-nonmagnetic", "transparent-opaque", "expensive-cheap", "thermally conductive-poorly thermally conductive", "hard-soft".

In an embodiment, the first mold tool and the second mold tool are assembled to one another before supplying the first mold material to the mold volume, and are only disassembled from one another for taking the physical body out of the mold tools after supplying the second (or more generally the last or final) mold material to the increased mold volume. Thus, the multiple molding procedure can be carried out within one and the same apparatus without removing portions or preforms of the molded body prior to the completion of all molding steps.

In an embodiment, the respective mold material comprises a mold compound, in particular a plastic mold compound. For instance, a correspondingly encapsulated chip may be provided by placing the electronic chip (if desired together with other components) between an upper mold die and a lower mold die and to inject liquid mold material therein. After solidification of the mold material (in particular after solidification of various different mold materials in different portions of the package to be formed), the package formed by the encapsulant(s) with the electronic chip in between is completed. If desired, the mold compound may be filled with particles improving its properties, for instance its heat removal properties.

In an embodiment, the electronic chip is a power semiconductor chip. In particular for power semiconductor chips, electric reliability, heat removal capability and other properties which are adjustable by the combination of different mold materials are important parameters which can be set with the described manufacturing procedure. Possible integrated circuit elements which can be monolithically integrated in such a semiconductor power chip are field effect transistors (such as insulated gate bipolar transistors or metal oxide semiconductor field effect transistors) diodes, etc. With such constituents, it is possible to provide electronic components usable as packages for automotive applications, high-frequency applications, etc. Examples for electric circuits which can be constituted by such and other power semiconductor circuits and packages are half-bridges, full bridges, etc.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 34 illustrates a plan view of a part of a supply unit of a molding apparatus according to an exemplary embodiment in a first operation state.

FIG. 35 illustrates a plan view of the supply unit according to FIG. 34 in a second operation state.

FIG. 36 illustrates a plan view of the supply unit according to FIG. 34 in a third operation state.

FIG. 41 illustrates a plan view of the supply unit according to FIG. 38 in a fourth operation state.

DETAILED DESCRIPTION OF EXEMPLARY EMBODIMENTS

Figure 1:
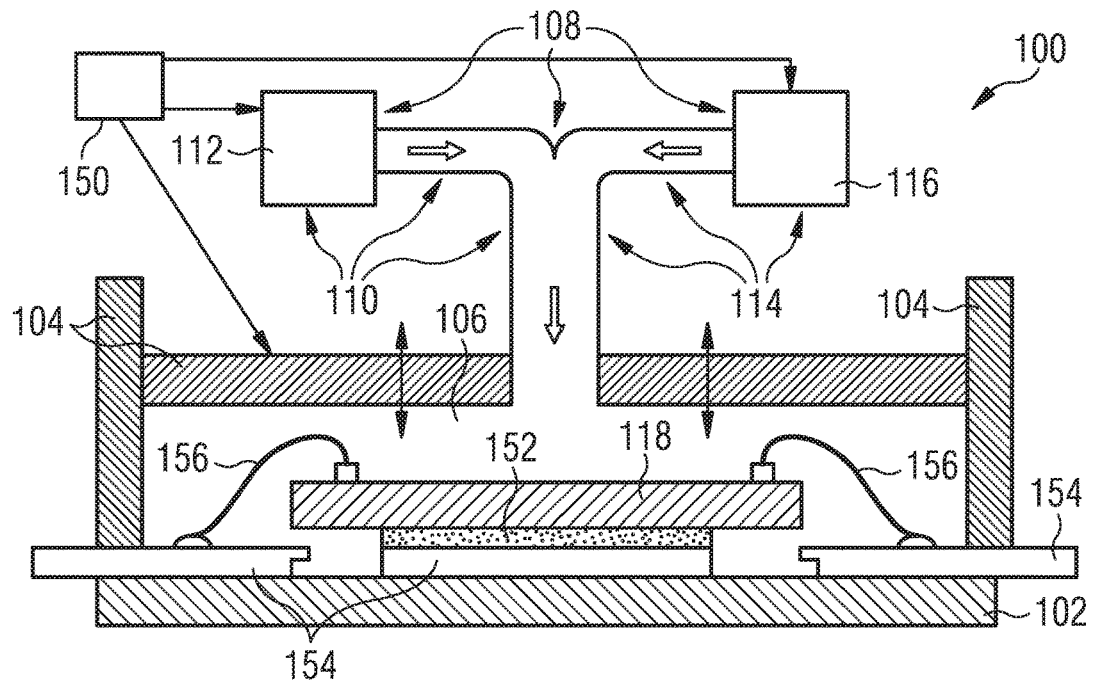
FIG. 1 illustrates a cross-sectional view of an apparatus for molding a physical body comprising two different mold materials according to an exemplary embodiment.

The illustration in the drawing is schematically and not to scale.

Before exemplary embodiments will be described in more detail referring to the figures, some general considerations will be summarized based on which exemplary embodiments have been developed.

According to an exemplary embodiment of the invention, a multiple mold transfer system is provided. In contrast to conventional approaches, an exemplary embodiment provides a mold system providing the opportunity to transfer multiple layers (or other structures) in a single mold cycle. In order to enable two-layer (or more generally multiple-layer) molding for semiconductor packaging, an exemplary embodiment provides a correspondingly configured mold apparatus and corresponding molding method. Such a mold system is for example highly advantageous for optocoupler packaging. In such an application, a first mold material can be implemented to constitute an inner mold material (for instance white or transparent) of the package to enable optical communication between an emitter (which may be a first electronic chip, for instance a light emitting diode) and a detector (which may be a second electronic chip, for instance a photodiode). Another second mold material may be provided to mold a black or an opaque mold material to block internal light from escaping to an environment and at the same time block external light from propagating towards an interior of the package, in particular towards the detector. Both (or more generally all) molding procedures may be integrated into a single apparatus and more specifically into a single molding chamber (also denoted as mold volume) with modifiable dimension(s) and with a supply unit capable of supplying different mold materials into the same molding chamber. These different mold materials may serve as a basis for multiple molding procedures in the same molding chamber for building up a package with at least two different mold compounds.

In contrast to this, conventional approaches use different apparatuses, each for forming exactly one mold material. This involves the shortcoming that each apparatus and hence each mold material requires its own degating and on/off load system. This involves high cost, huge production space utilization, and also a complex molding process.

In contrast to this, an exemplary embodiment of the invention performs the manufacture of multiple mold materials for the formation of multiple mold layers or structures in terms of semiconductor packaging in a single mold cycle. This can be achieved in particular by a mold cavity design having a moving cavity part for multi-layer mold formation. It is also possible to provide a multiple pot and multiple plunger system in a single apparatus to handle supply of multiple mold materials. Moreover, it is also possible to implement a multiple runner and gate system to transfer each material in each layer molding sequence. Exemplary embodiments may in particular involve any of transfer molding and compression molding.

An exemplary embodiment of the present invention therefore relates to the design of a mold apparatus which carries out a method of making a multiple mold transfer system using a moving cavity system in transfer molding equipment. Such an embodiment of the invention may enable the molding equipment to encapsulate a semiconductor package with different package size without changing the mold tools or without mold cavity conversion. An exemplary embodiment of the invention also enables the transfer of two or more mold materials to the mold cavity in different stages within a single mold press or molding cycle.

To achieve this, it is possible to equip the apparatus with a fix cavity bar and a moving cavity to enable molding of different package sizes without mold tool conversion. Moreover, it is possible to enable a mold transfer with two or more materials implementing a multi-transfer line (compare FIG. 34 to FIG. 37) or a single transfer line with dummy spacer loading in between two separate mold pellets of different materials.

In an embodiment, a mold apparatus for multiple mold material transfer in one mold cycle (in particular for semiconductor packaging) is hence provided which comprises a movable mold cavity (as one mold tool) and a multiple molding plunger system. Movable mold cavity means in particular a fix part (cavity bar) with a slot for an insert cavity which is movable in vertical direction (implementing another mold tool).

Such an apparatus may also comprise a moving cavity, wherein the holder which holds all cavity bars may be controlled by an external slider or a gearing system, etc., to move the cavity up and down.

The apparatus may be controlled automatically (for instance by a corresponding software code) or manually by a human operator.

Furthermore, the apparatus may comprise a mold transfer system which has a single pot (i.e. mold material container), handling multiple mold materials being spatially separated by a material spacer (also denoted as dummy spacer).

In still another exemplary embodiment, a mold supply or transfer system of the apparatus may have multiple pellet pots (i.e. multiple separate mold material containers containing different mold materials), handling multiple mold materials by separate plunger line systems.

The apparatus may furthermore be configured for transferring the mold material in difference stages in one mold cycle without taking out the sample (i.e. the preform of the package under fabrication).

The described movable cavity system forming an apparatus according to an exemplary embodiment of the invention may comprise a fix cavity bar with slot insert, a cavity insert, a cavity insert holder, a mechanical gear system, and a z-height controller (which may be a manual or automatic system controllable by a control unit). The z-direction may correspond to a vertical direction under ordinary operation conditions of the apparatus. A multi transfer system according to an embodiment of the invention comprises a multiple pot cull block, a multi plunger system, a moving top cull block, a multi runner system and a multi transfer plunger beam control system.

FIG. 1 illustrates a cross-sectional view of an apparatus 100 according to an exemplary embodiment for molding a physical body 200 (see for example the packages of FIG. 2A and FIG. 2B), wherein the physical body 200 may also be denoted as molded body. The manufactured physical body 200 may comprise two different mold materials 202, 204 (see again FIG. 2A and FIG. 2B), i.e. two different mold compounds made of different materials or different material compositions.

The apparatus 100 comprises a first mold tool 102 and a cooperating second mold tool 104 which are together configured for defining or delimiting a mold volume 106 in between. In other embodiments, it is also possible that the mold volume 106 or mold chamber is defined by three or more mold tools. In the embodiment of FIG. 1, the first mold tool 102 is a bottom mold tool and the second mold tool 104 is a top mold tool. The shape and dimension of the mold volume 106 is defined by the first mold tool 102 and the second mold 104. The physical body 200 to be molded (compare for example FIG. 2A or FIG. 2B) has consequently a shape corresponding to the mold volume 106 (which may accommodate constituents 118, 152, 154, 156, etc., and which is preferably completely filled up with the mold materials 202, 204 during molding). The molded or physical body 200 comprises, as can be taken from FIG. 2A or FIG. 2B as well, two different mold materials 202, 204 with different physical properties (for instance one being optically transparent and the other one being opaque). More specifically, the second mold tool 104 is movable (see double arrows in FIG. 1) to thereby increase or decrease the dimension of the mold volume 106 exclusively in a stacking direction (which is the vertical direction according to FIG. 1) of the first mold tool 102 and the second mold tool 104. Consequently, the first mold tool 102 and the second mold tool 104 are configured so that despite of the motion of the second mold tool 104, the dimension of the mold volume 106 remains constant in a plane perpendicular to the stacking direction of the first mold tool 102 and the second mold tool 104 (the horizontal plane according to FIG. 1). In other embodiments, it is however also possible that, additionally or alternatively, the lateral dimensions of the mold volume 106 are adjustable by the motion of at least a part of at least one of mold tools 102, 104. The first mold tool 102 is stationary according to the embodiment of FIG. 1. However, the second mold tool 104 is configured to be movable (as indicated by the double arrows in FIG. 1) to thereby modify the dimension of the mold volume 106.

For instance, the second mold tool 104 may be moved to a first spatial position before molding the first mold material 202, which can hence be supplied until the mold volume 106 corresponding to the first spatial position is completely filled up with the first mold material 202. The first mold material 202 may then be cured or solidified. Thereafter, the second mold tool 104 may be moved to a second spatial position (in which the mold volume 106 is larger than before) before molding the second mold material 204 onto the first mold material 202, which can hence be supplied until the now extended mold volume 106 corresponding to the second spatial position is completely filled up with the second mold material 204. The second mold material 204 may then be cured or solidified. The readily molded physical body 200 may then be removed from the apparatus 100.

In addition to the mold tools 102, 104, the apparatus 100 further comprises a supply unit 108 configured for supplying the two mentioned different mold materials 202, 204 to the mold volume 106. As can be taken from FIG. 1, the supply unit 108 comprises a first supply path 110 configured for supplying the first mold material 202 from a first reservoir 112 to the mold volume 106. Moreover, the supply unit 108 comprises a second supply path 114 configured for supplying the second mold material 204 from a second reservoir 116 to the mold volume 106.

The first mold tool 102 and the second mold tool 104 are assembled to one another before supplying the first mold material 202 to the mold volume 106, and are only disassembled from one another for taking the fabricated physical body 200 out of the mold tools 102, 104 after supplying the second mold material 204 to the increased mold volume 106.

In order to carry out the molding procedure, a chip carrier 154 such as a lead frame is placed on and/or in the first mold tool 102 and inside the mold volume 106. Subsequently, an electronic chip 118 (such as a naked die) is attached to the chip carrier 154 (for instance via an adhesive 152) and is placed as well within the mold volume 106. One or more bond wires 156 may be then used for connecting chip pads on an upper main surface of the electronic chip 118 with the chip carrier 154. The second mold tool 104 may then be placed on top of the first mold tool 102 with the chip carrier 154 in between so as to circumferentially define the present shape and dimension of the mold volume 106. The mentioned pre-mounting procedures (i.e. attaching electronic chip 118 to chip carrier 154 and wire bonding) may also be carried out before placing a corresponding pre-mounted assembly between the first mold tool 102 and the second mold tool 104.

A control unit 150 (such as a microprocessor or a central processing unit, CPU) may then control the first reservoir 112 to supply a predefined amount of the first mold material 202 via the first supply path 110 to the mold volume 106. Consequently, the electrically connected electronic chip 118 as well as part of the chip carrier 154 are encapsulated by the first mold material 202. After that, the first mold material 202 may be cured and solidified within the mold volume 106. Subsequently, the control unit 150 may control the second mold tool 104 to move in an upward direction according to FIG. 1 to increase the mold volume 106. During this motion, the encapsulated electronic chip 118 remains within the apparatus 100, i.e. between the first mold tool 102 and the second mold tool 104 without being removed from the mold volume 106. The control unit 150 may then control the second reservoir 116 to supply a predefined amount of the second mold material 204 via the second supply path 114 to the extended mold volume 106. Consequently, the electrically connected and already encapsulated electronic chip 118 as well as part of the chip carrier 154 are additionally encapsulated by the second mold material 204 which also covers the first mold material 202. After that, the second mold material 204 may be cured and solidified within or outside of the extended mold volume 106. Thereafter, the first mold tool 102 and the second mold 104 may be separated from one another so as to allow the readily manufactured package to be removed out of the apparatus 100.

Figure 2A:
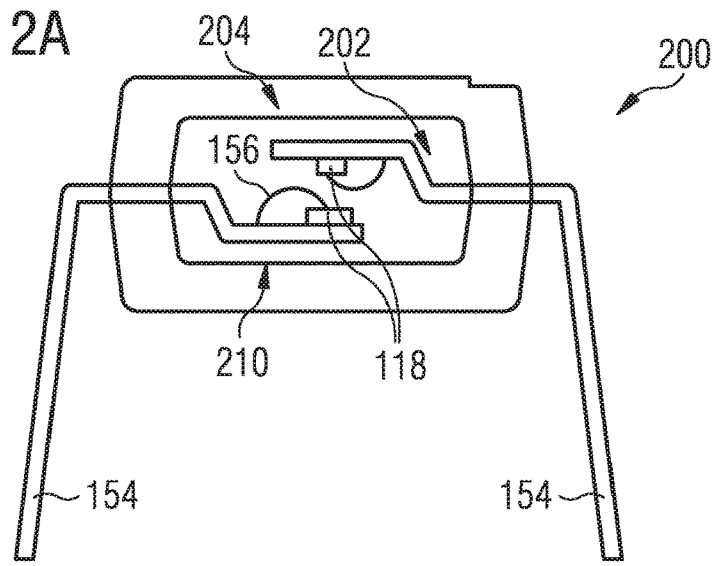
FIG. 2A and FIG. 2B illustrate cross-sectional views of packages manufactured by a method according to an exemplary embodiment.
Figure 2B:
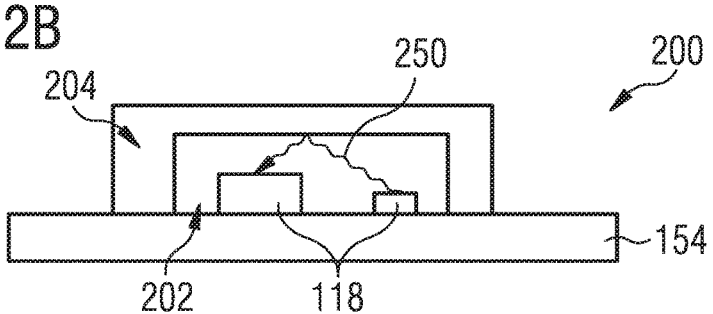

FIG. 2A and FIG. 2B illustrate cross-sectional views of packages, as examples for physical bodies 200, manufactured by a method according to an exemplary embodiment. Referring to FIG. 2A and FIG. 2B, a respective semiconductor package may be manufactured as the double molded physical body 200. Each of the illustrated semiconductor packages comprises (in these embodiments two, wherein any other number one, three, four, etc. is possible as well) semiconductor chips 118 which are encapsulated by the first mold material 202 which is, in turn, encapsulated by the second mold material 204. In both embodiments, the first mold material 202 is optically transparent and the second mold material 204 is optically opaque or non-transparent.

According to FIG. 2A, the physical body 200 is configured as an optocoupler package. The first mold material 202 is here embodied as an internal resin (for instance white), whereas the second mold material 104 is embodied as an external resin (for instance black). Reference numeral 210 indicates an internal creepage surface.

According to FIG. 2B, the physical body 200 is configured as a light-emitting diode package. The physical body 200 according to FIG. 2B comprises a first electronic chip 118 shown on the right hand side and being an emitter configured for emitting electromagnetic radiation 250 such as light, and comprises a second electronic chip 118 shown on the left hand side and being a detector configured for detecting the electromagnetic radiation 250. Again, the first mold material 202 forming a first layer is optically transparent. The second mold material 204 forming a second layer is white with titanium oxide (TiO2).

Both the embodiment of FIG. 2A and the embodiment of FIG. 2B can be manufactured in a single mold transfer apparatus 100, in which all molding procedures for molding mold structures 202, 204 can be carried out in a single mold cycle with a moving mold tool design and a multiple step transfer molding system. Such a multilayer molding architecture integrated in a single apparatus 100 reduces manufacturing effort, large space requirements and manufacturing complexity.

Figure 3:
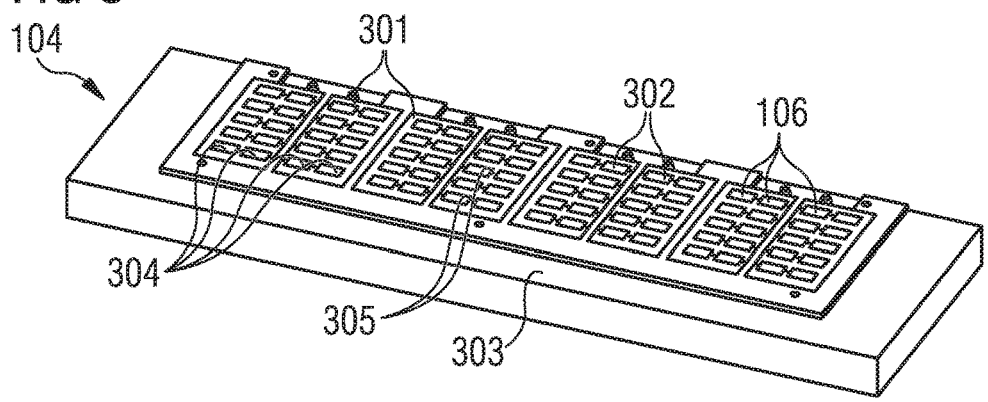
FIG. 3 illustrates a top mold tool of a molding apparatus according to an exemplary embodiment.
Figure 4:
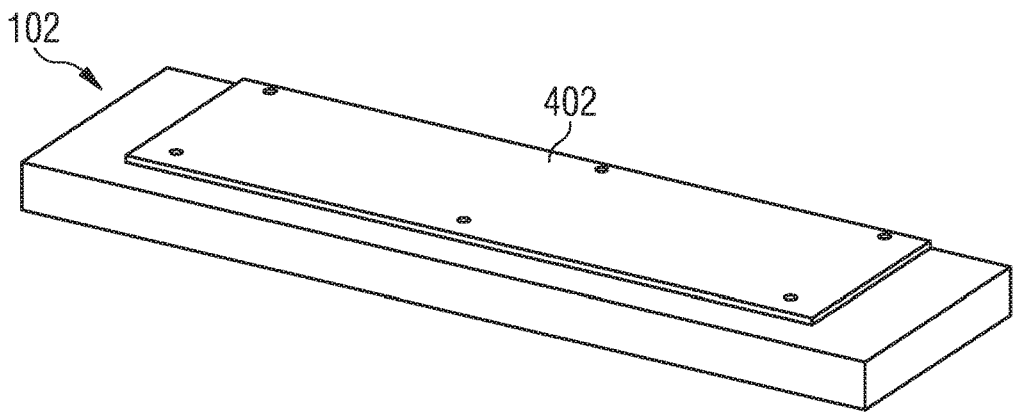
FIG. 4 illustrates a bottom mold tool of a molding apparatus according to an exemplary embodiment.
Figure 5:
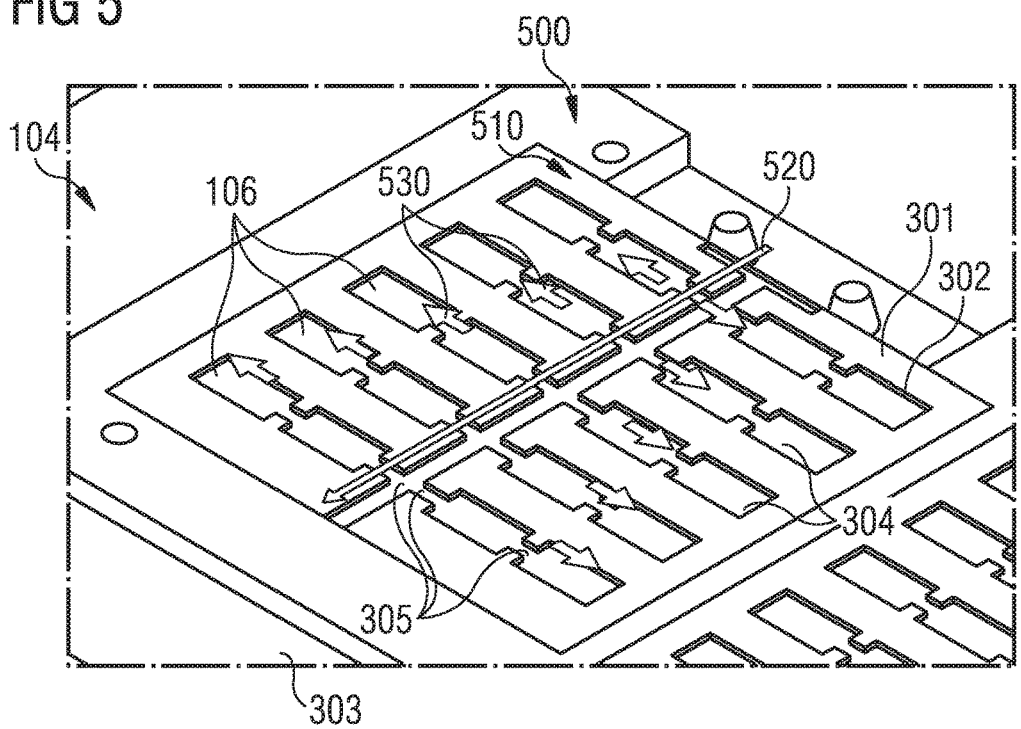
FIG. 5 illustrates a detailed view of the top mold tool of FIG. 3 in a first operation mode.
Figure 6:
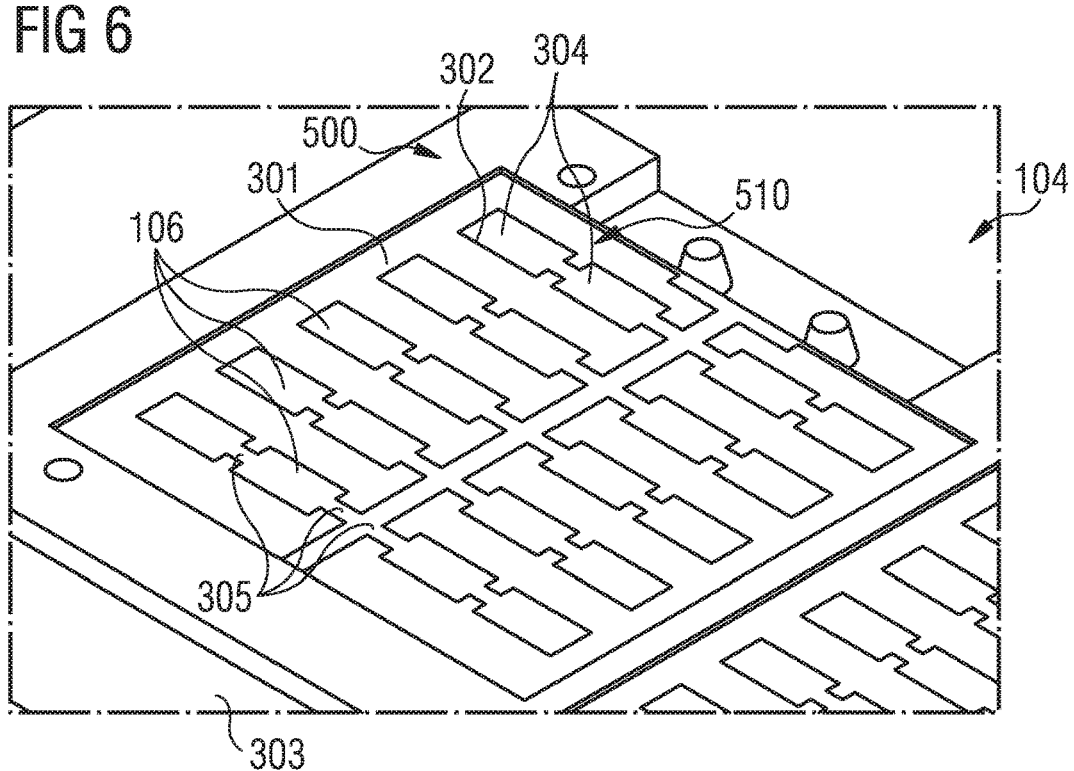
FIG. 6 illustrates a detailed view of the top mold tool of FIG. 3 in a second operation mode.

FIG. 3 illustrates a top side oriented second mold tool 104 (or top cavity) of a molding apparatus 100 according to an exemplary embodiment of the invention. FIG. 4 illustrates a corresponding bottom side oriented first mold tool 102 (or bottom cavity) of the molding apparatus 100 according to FIG. 3. FIG. 5 illustrates a detailed view of the second mold tool 104 of FIG. 3 in a first operation mode during a first molding procedure. FIG. 6 illustrates a detailed view of the second mold tool 104 of FIG. 3 in a second operation mode during a second molding procedure.

What concerns the top side second mold tool 104, part of the mold volume 106 is delimited by a three-dimensionally profiled boundary surface 302 of the second mold tool 104. What concerns the bottom side first mold tool 102, a remaining part of the mold volume 106 is delimited by a planar boundary surface 402 of the first mold tool 102. Specifically the second mold tool 104 shown in FIG. 3 is configured so that the mold volume 106 comprises a plurality of separate individual distinct volume sections 304 or compartments being in fluid communication with one another via connection channels 305 (i.e. are arranged so that a liquid can flow between the various volume sections 304). One respective molded or physical body 200 is manufacturable in each of the volume sections 304. Each of the volume sections 304 is adjustable in size by moving part of the second mold tool 104 so that a batch manufacture of multiple physical bodies 200 with two or more different mold materials 202, 204 is possible without the need to move preforms of the physical bodies 200 between different mold apparatuses during the multi-mold procedure.

Two parts 301 and 303 of the second mold tool 104 are assembled into the mold chase in order to form a functional cavity set for molding a package as physical body 200. A corresponding apparatus 100 provides a moving feature to the moving cavity by adjusting the moving cavity insert by controlling the cavity insert holder in z-direction (i.e. a direction perpendicular to a plane in which the volume sections 304 are arranged, here in a matrix like arrangement). The moving cavity having a groove at the opposite side of the moving cavity surface may be held by the cavity holder. In particular, a cavity holder is provided which comprises a gripping holding the groove, gear, slider or any similar feature for height adjustment purpose (moving the moving cavity) according to user preferences.

FIG. 3 hence shows an overview of a top cavity, whereas FIG. 4 shows an overview of a corresponding bottom cavity. FIG. 5 shows the first step in a mold transfer procedure, whereas FIG. 6 shows a second step of the mold transfer procedure. The respective fix cavity (at level 0) is denoted with reference numeral 500 in FIG. 5 and in FIG. 6. The respective moving cavity is denoted with reference numeral 510 in FIG. 5 and in FIG. 6 and is shown in FIG. 5 at the initial position (i.e. at level 0) and is shown in FIG. 6 after having moved to position x mm from level 0. A mold flow path according to which the first mold material 202 is supplied into the volume sections 304 is shown in FIG. 5 with arrows 520, 530.

Figure 7:
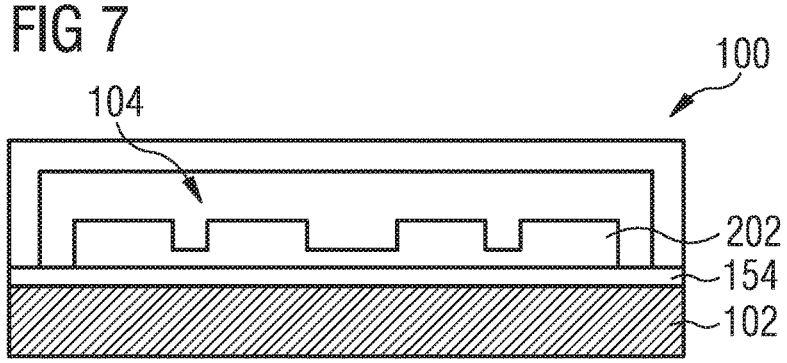
FIG. 7 illustrates a cross-section of a part of the molding apparatus according to FIG. 3 to FIG. 6 with the top mold tool in a first position after molding a first mold material.
Figure 8:
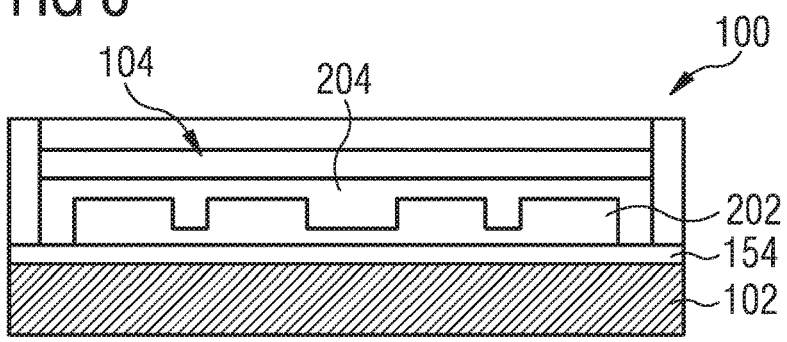
FIG. 8 illustrates a cross-section of a part of the molding apparatus according to FIG. 3 to FIG. 6 with the top mold tool in a second position after molding a second mold material.

FIG. 7 illustrates a cross-section of a part of the molding apparatus 100 according to FIG. 3 to FIG. 6 with the second mold tool 104 in a first position after molding the first mold material 202 (compare FIG. 5). FIG. 8 illustrates a cross-section of this part of the molding apparatus 100 according to FIG. 3 to FIG. 6 with the second mold tool 104 in a second position after molding the second mold material 204 (compare FIG. 6).

In FIG. 7 and FIG. 8, chip carrier 154 (on which electronic chips 118, not shown in FIG. 7 and FIG. 8, is mounted) is partially inserted between the bottom side first mold tool 102 and the top side second mold tool 104. In order to transfer the apparatus 100 from the operation mode of FIG. 7 to the operation mode of FIG. 8, the second mold tool 104 is moved upwardly relative to the first mold tool 102 so that the interior mold volume 106 is increased for enabling supply of second mold material 204 after having completed molding of first mold material 202. By taking this measure, twofold is possible: On the one hand, the internal mold volume 106 may be adjusted to assume a desired size in accordance with a size of a semiconductor package to be manufactured. On the other hand, multiple mold procedures using the same or different mold materials 202, 204 may be carried out in one and the same apparatus 100. FIG. 7 illustrates the result of the first mold procedure, i.e. first mold material 202 covering the chip carrier 154. Correspondingly, FIG. 8 illustrates the result of the second mold procedure, i.e. second mold material 204 covering the first mold material 202.

Figure 9:
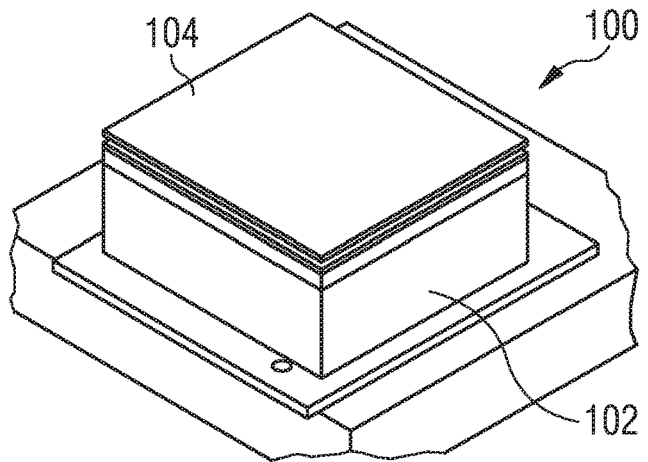
FIG. 9, FIG. 12 and FIG. 15 illustrate a top isometric view, a three-dimensional view, and a side view of a molding apparatus according to an exemplary embodiment with the top mold tool in a first position.
Figure 10:
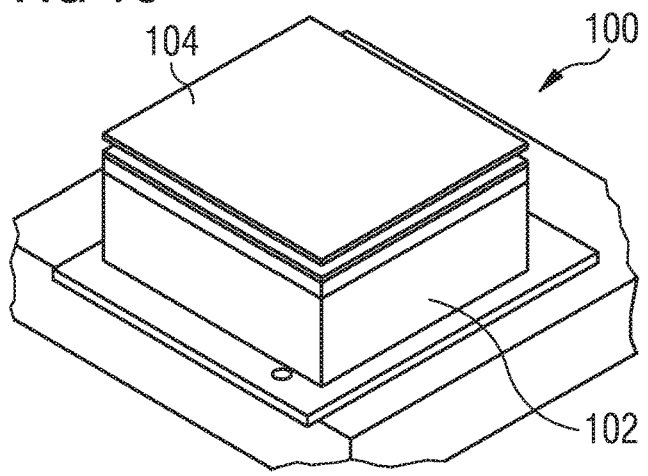
FIG. 10, FIG. 13 and FIG. 16 illustrate a top isometric view, a three-dimensional view, and a side view of the molding apparatus according to FIG. 9, FIG. 12 and FIG. 15 with the top mold tool in a second position.
Figure 11:
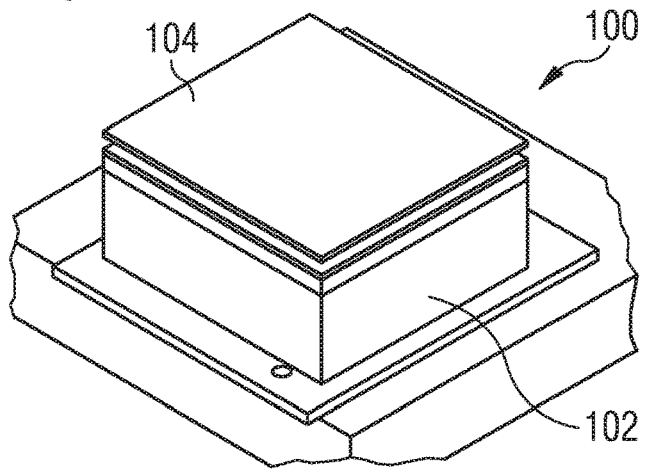
FIG. 11, FIG. 14 and FIG. 17 illustrate a top isometric view, a three-dimensional view, and a side view of the molding apparatus according to FIG. 9, FIG. 12 and FIG. 15 with the top mold tool in a third position.
Figure 12:
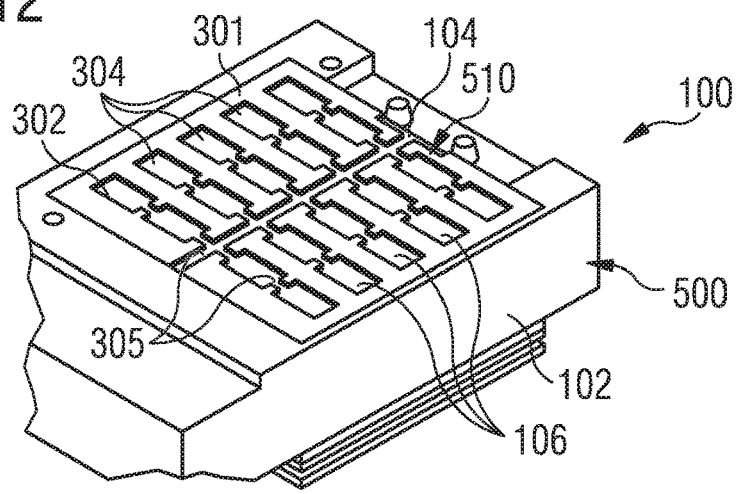
Figure 13:
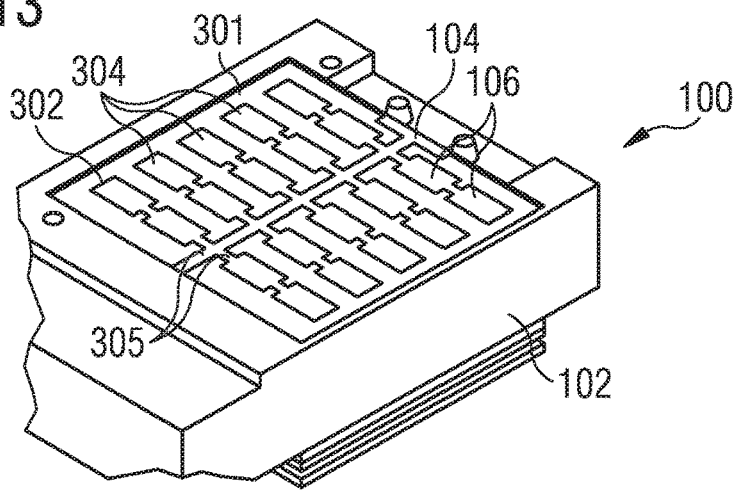
Figure 14:
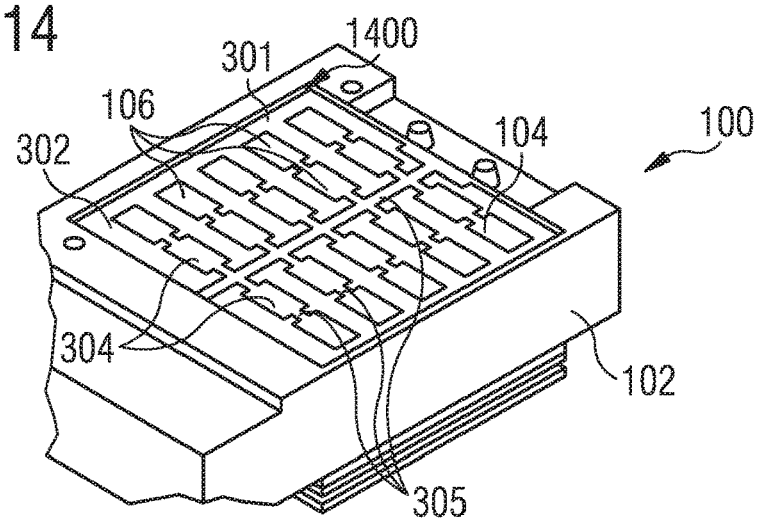
Figure 15:
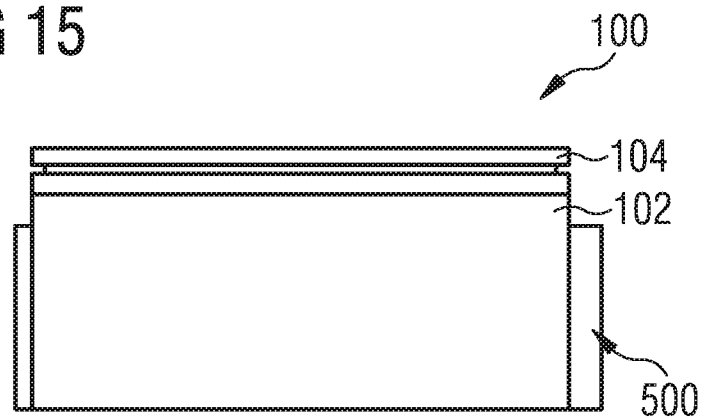
Figure 16:
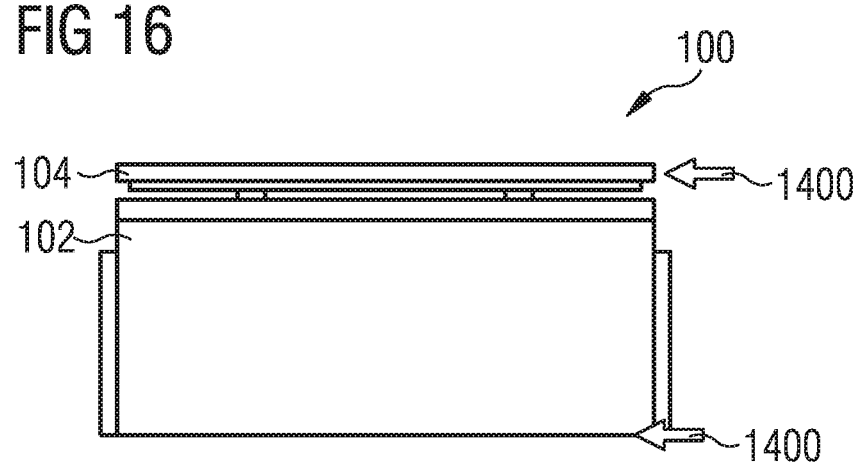
Figure 17:
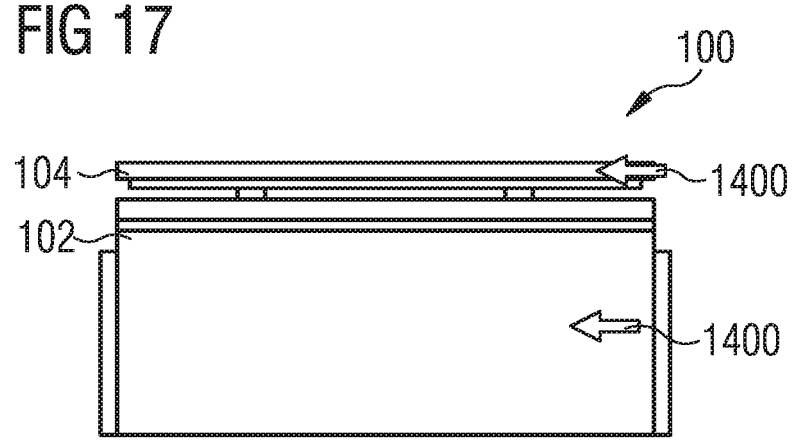

Referring to FIG. 9 to FIG. 17, operation of an apparatus 100 according to an exemplary embodiment of the invention is illustrated. FIG. 9, FIG. 12 and FIG. 15 illustrate a three-dimensional view/top isometric view (see FIG. 9), a three-dimensional view of a detail (see FIG. 12), and a side view (see FIG. 15) of the apparatus 100 according to the exemplary embodiment with the top side second mold tool 104 in a lowermost first position (for instance at zero level). This operation mode relates to an initial condition for forming the inner mold. Correspondingly, FIG. 10, FIG. 13 and FIG. 16 illustrate a three-dimensional view/top isometric view (see FIG. 10), a three-dimensional view of a detail (see FIG. 13), and a side view (see FIG. 16) of the molding apparatus 100 according to FIG. 9, FIG. 12 and FIG. 15 with the top side second mold tool 104 in an intermediate second position. This operation mode relates to a second step involving motion of an inner part of the apparatus 100 and hence shows the progress of moving the upper cavity upwardly. In accordance with the foregoing, FIG. 11, FIG. 14 and FIG. 17 illustrate a three-dimensional view/top isometric view (see FIG. 11), a three-dimensional view of a detail (see FIG. 14), and a side view (see FIG. 17) of the molding apparatus 100 according to FIG. 9, FIG. 12 and FIG. 15 with the top side second mold tool 104 in an uppermost third position. This operation mode relates to a final position of the moving cavity. Moving parts are indicated with reference numeral 1400.

Figure 18:
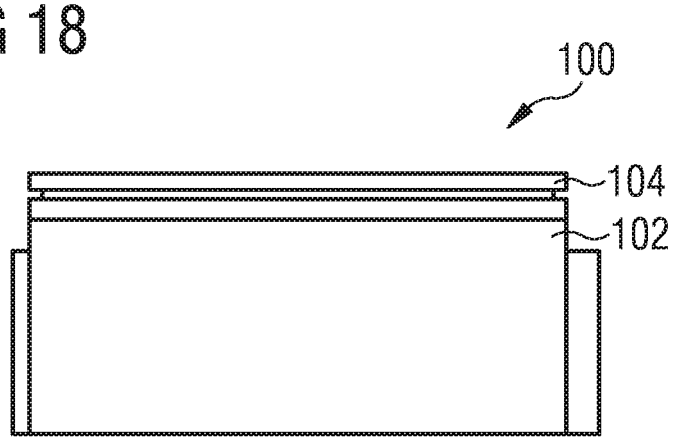
FIG. 18 illustrates a side view of a molding apparatus according to an exemplary embodiment with a top mold tool in a first position.
Figure 19:
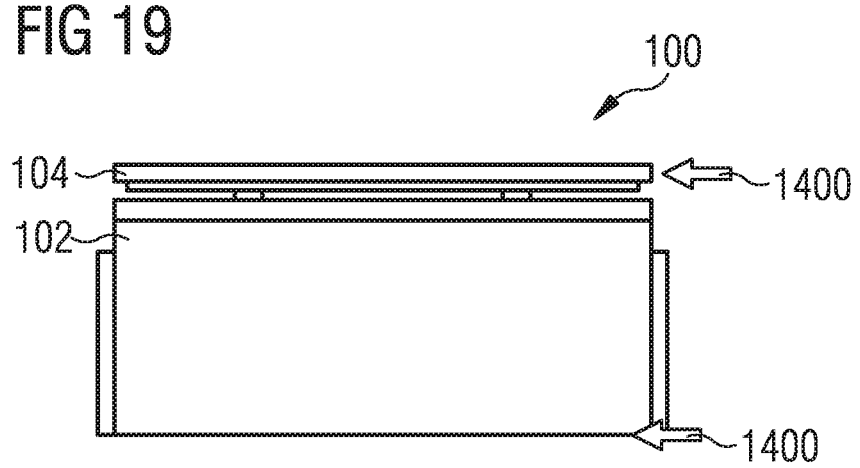
FIG. 19 illustrates a side view of the molding apparatus according to FIG. 18 with the top mold tool in a second position.

FIG. 18 illustrates a side view of a molding apparatus 100 according to an exemplary embodiment with a top side second mold tool 104 in a first position. FIG. 19 illustrates a side view of the molding apparatus 100 according to FIG. 18 with the top side second mold tool 104 in a second position. FIG. 18 shows the initial position corresponding to the formation of the inner mold structure. FIG. 19 indicates a motion (see reference numeral 1400) by which a flexible package sizing can be accomplished in terms of width, length and height.

Figure 20:
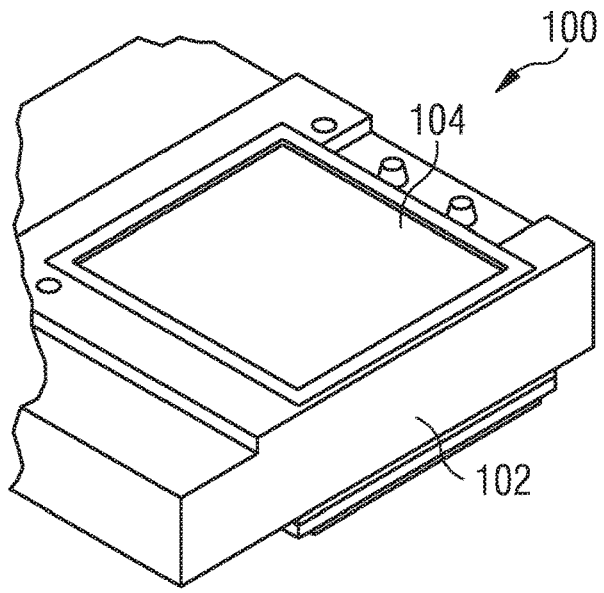
FIG. 20 illustrates a three-dimensional or view of the molding apparatus in the position according to FIG. 18.
Figure 21:
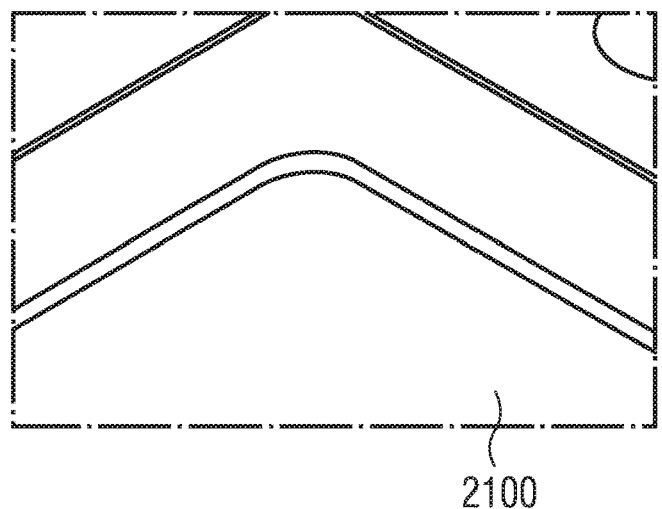
FIG. 21 illustrates a detail of the image according to FIG. 20.
Figure 22:
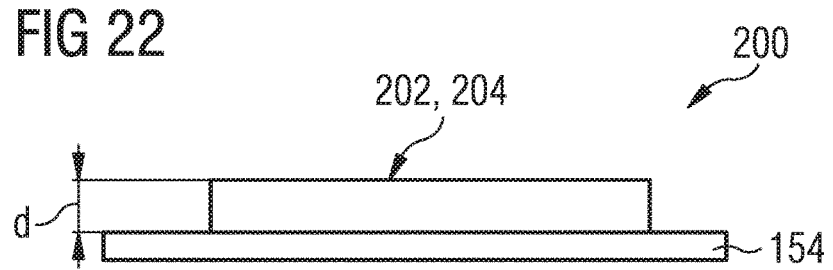
FIG. 22 illustrates a package manufactured using the molding apparatus in the configuration according to FIG. 18.

FIG. 20 illustrates a three-dimensional view of the molding apparatus 100 in the position according to FIG. 18. FIG. 21 illustrates a detail of the image according to FIG. 20. Reference numeral 2100 indicates a movable surface. FIG. 22 illustrates a package as physical body 200 manufactured using the molding apparatus 100 in the configuration according to FIG. 18. The shown configuration results in a package with a thickness, d, of 1 mm. Depending on the degree of motion of the moving surface 2100, package thickness can be adjusted.

Figure 23:
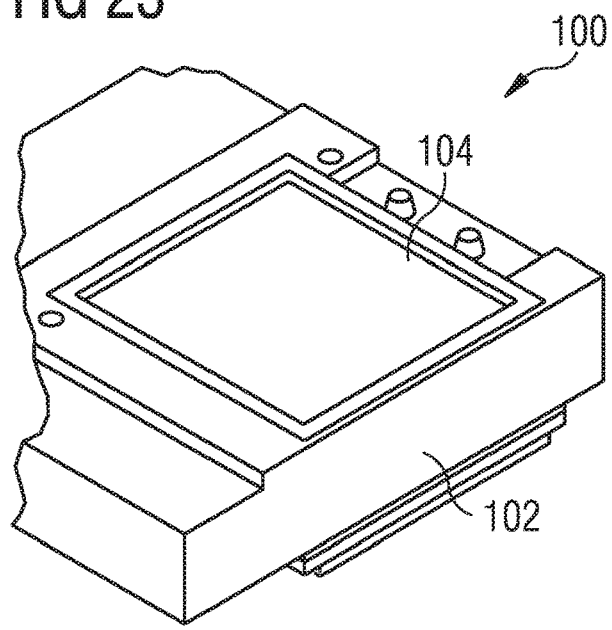
FIG. 23 illustrates a three-dimensional view of the molding apparatus in the position according to FIG. 19.
Figure 24:
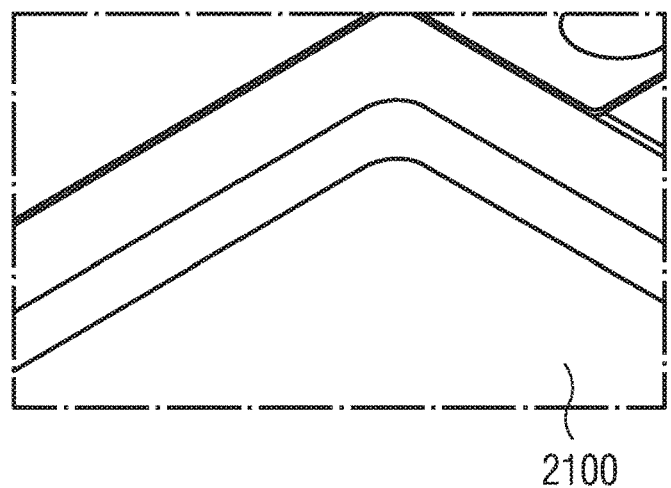
FIG. 24 illustrates a detail of the image according to FIG. 23.
Figure 25:
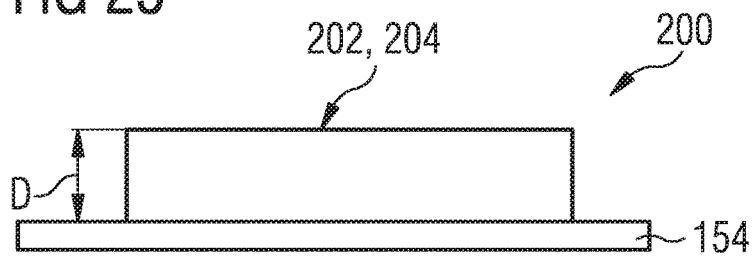
FIG. 25 illustrates a package manufactured using the molding apparatus in the configuration according to FIG. 19.

FIG. 23 illustrates a three-dimensional or view of the molding apparatus 100 in the position according to FIG. 19. FIG. 24 illustrates a detail of the image according to FIG. 23. FIG. 25 illustrates a package as physical body 200 manufactured using the molding apparatus 100 in the configuration according to FIG. 19. A comparison of Figure to FIG. 22 with FIG. 23 to FIG. 25 shows that increased motion increases the mold volume 106 which, in turn, results in a larger thickness, D (for instance 2 mm), of the package shown in FIG. 25.

Figure 26:
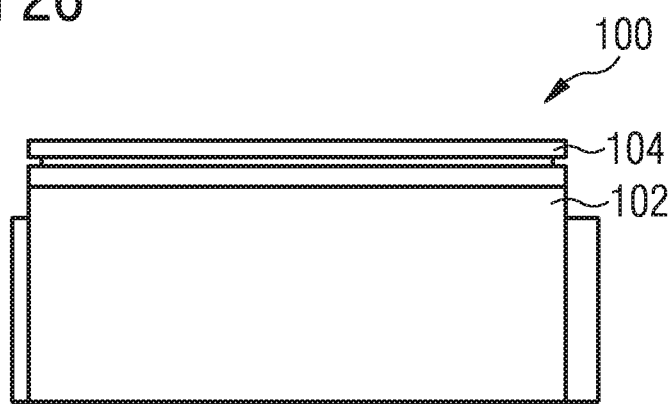
FIG. 26 illustrates a side view of a molding apparatus according to an exemplary embodiment with a top mold tool in a first position.
Figure 27:
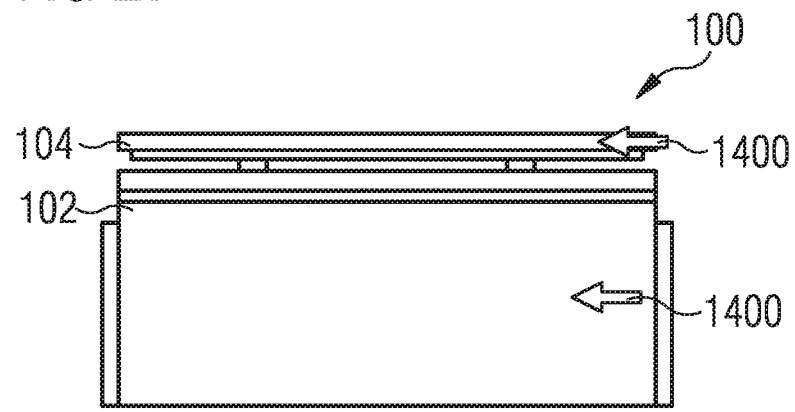
FIG. 27 illustrates a side view of the molding apparatus according to FIG. 26 with the top mold tool in a second position.

FIG. 26 illustrates a side view of a molding apparatus 100 according to an exemplary embodiment with a top side second mold tool 104 in a first position. FIG. 27 illustrates a side view of the molding apparatus 100 according to FIG. 26 with the top side second mold tool 104 in a second position. FIG. 26 shows a position corresponding to the formation of the inner mold. FIG. 27 indicates a motion (see reference numeral 1400) by which a flexible package sizing can be accomplished in terms of width, length and height.

Figure 28:
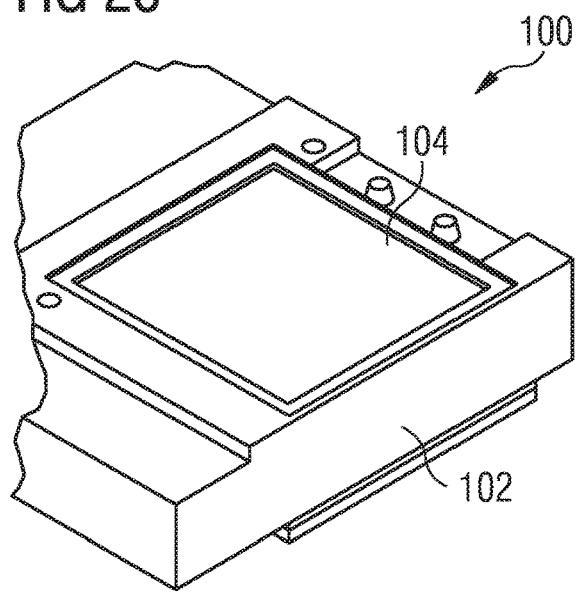
FIG. 28 illustrates a three-dimensional or view of the molding apparatus in the position according to FIG. 26.
Figure 29:
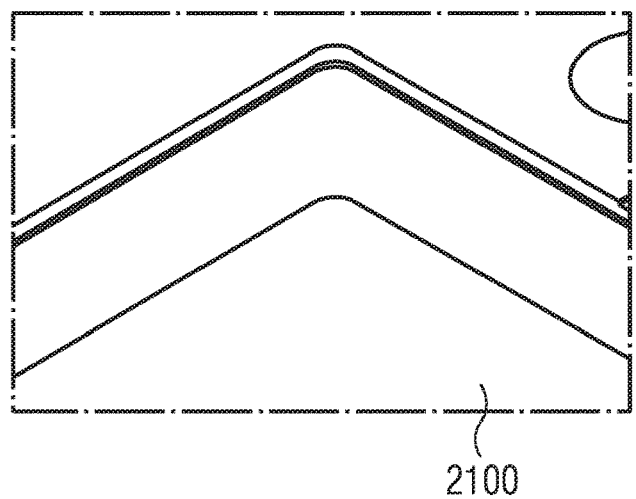
FIG. 29 illustrates a detail of the image according to FIG. 28.
Figure 30:
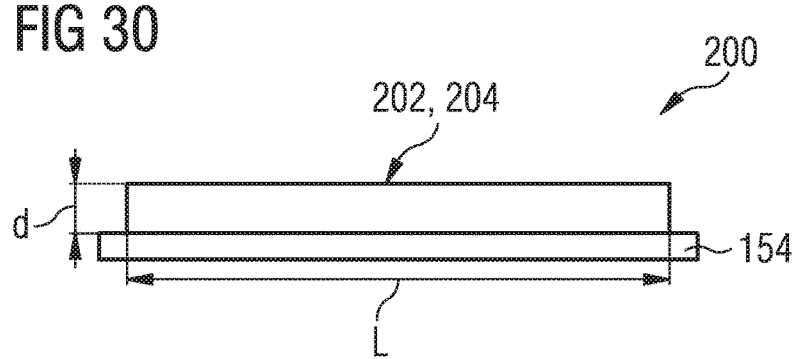
FIG. 30 illustrates a package manufactured using the molding apparatus in the configuration according to FIG. 26.

FIG. 28 illustrates a three-dimensional view of the molding apparatus 100 in the position according to FIG. 26. FIG. 29 illustrates a detail of the image according to FIG. 28. FIG. 30 illustrates a package as physical body 200 manufactured using the molding apparatus 100 in the configuration according to FIG. 26. The shown configuration results in a package 200 with a thickness, d, of 1 mm and with a length, L, of for instance 1 cm. Depending on the degree of motion of the moving surface 2100 and side walls delimiting the mold volume 106, package thickness and package length can be adjusted.

Figure 31:
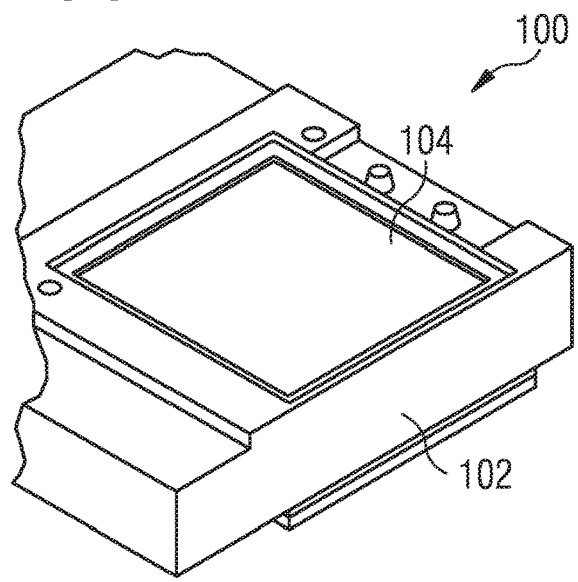
FIG. 31 illustrates a three-dimensional view of the molding apparatus in the position according to FIG. 27.
Figure 32:
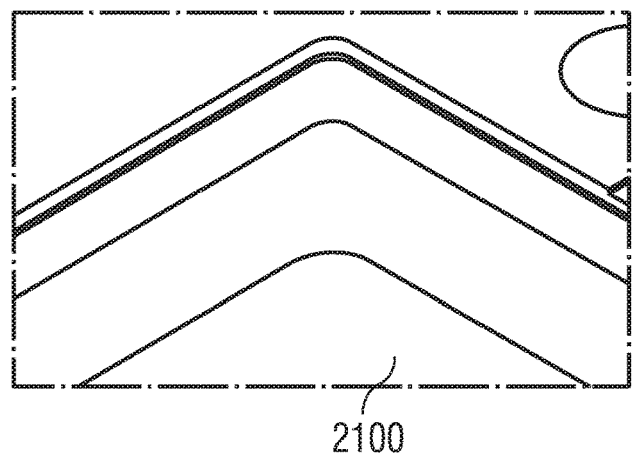
FIG. 32 illustrates a detail of the image according to FIG. 31.
Figure 33:
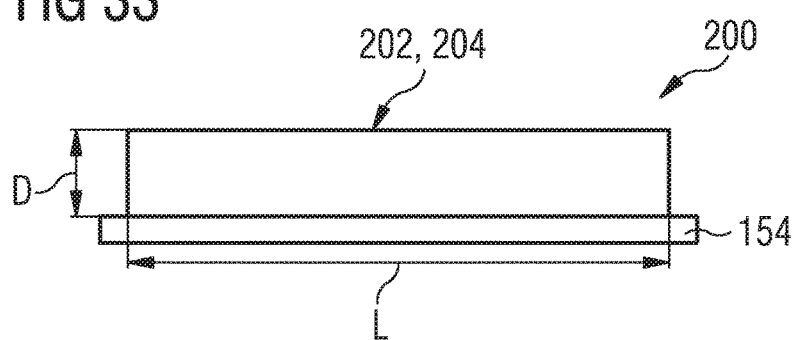
FIG. 33 illustrates a package manufactured using the molding apparatus in the configuration according to FIG. 27.

FIG. 31 illustrates a three-dimensional view of the molding apparatus 100 in the position according to FIG. 27. FIG. 32 illustrates a detail of the image according to FIG. 31. FIG. 33 illustrates a package as physical body 200 manufactured using the molding apparatus 100 in the configuration according to FIG. 27. The shown configuration results in a package with a thickness, D, of 2 mm and with a length, L, of 1 cm.

Figure 37:
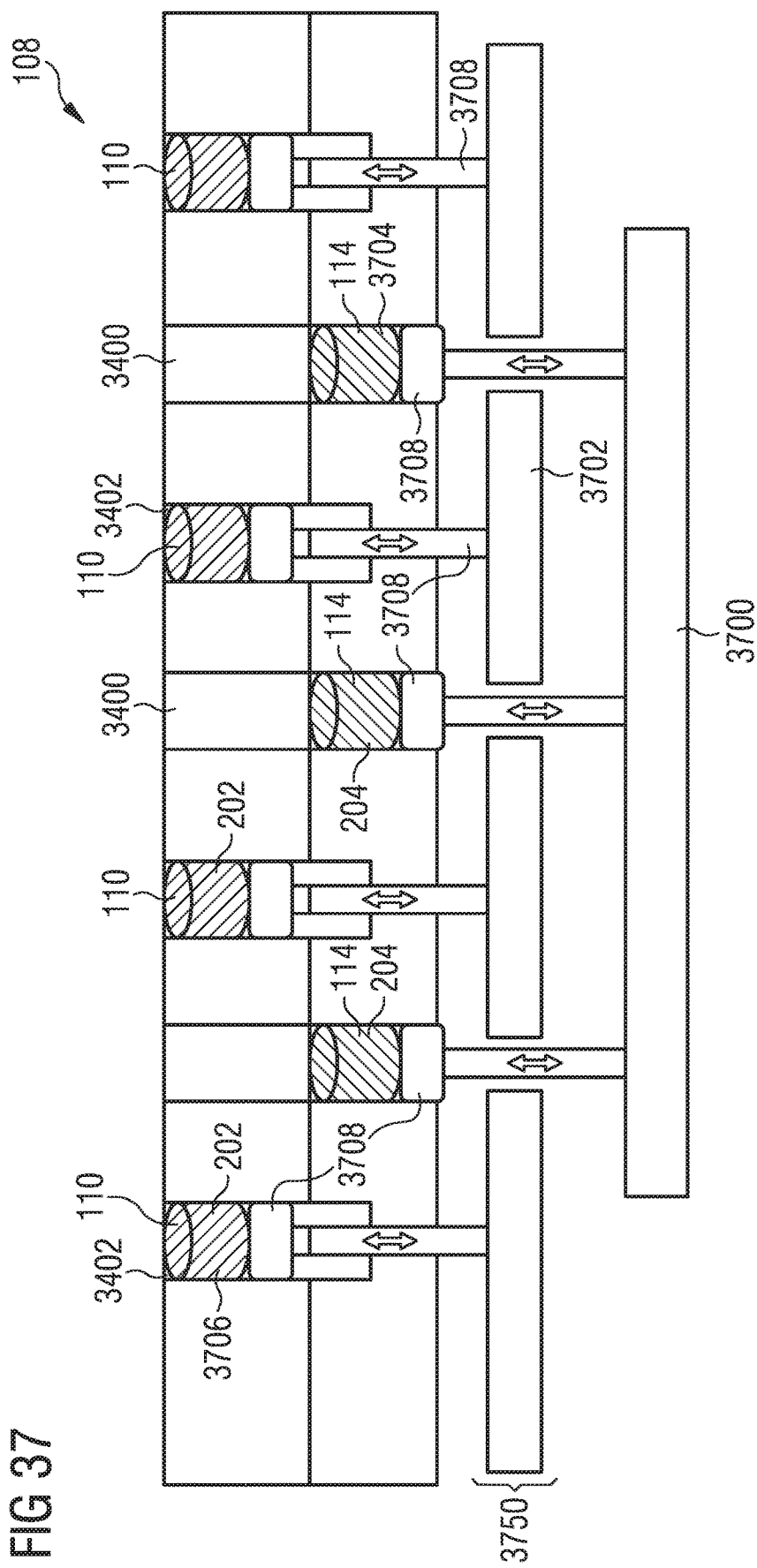
FIG. 37 illustrates a cross-sectional view of a part of the supply unit according to FIG. 34 to FIG. 36.

FIG. 34 illustrates a plan view of a part of a supply unit 108 of a molding apparatus 100 according to an exemplary embodiment in a first operation state. FIG. 35 illustrates a plan view of the supply unit 108 according to FIG. 34 in a later second operation state. FIG. 36 illustrates a plan view of the supply unit 108 according to FIG. 34 in a still later third operation state. FIG. 37 illustrates a cross section of a part of the supply unit 108 according to FIG. 34 to FIG. 36.

In other words, FIG. 34 to FIG. 36 show respective top views of a cavity and cull block assembly of the apparatus 100, in particular showing two different mold materials transferred to mold volumes 106 of a mold cavity in the framework of two different pot and plunger systems within a mold set up. FIG. 37 illustrates a side view of this pot and plunger set up.

Thus, the multi mold transfer system can be embodied with two or more separate pot and plunger systems in a single cull block. Consequently, two or more mold materials 202, 204 can be inserted via two different pots 3400, 3402 and may be transferred with different or alternating timing. More specifically, a first mold material 202 may be loaded into and supplied from pot 3402 and a second mold material 204 may be loaded into and supplied from another pot 3400.

The position of the second mold material pot 3400 is held by a second plunger beam system 3700, arranged lower than the first mold material which is located at a heating zone 3750, held by a first plunger beam system 3702 in the initial stage (compare FIG. 37). Once chip carrier 154 (such as a leadframe, not shown in FIG. 34 to FIG. 37) and mold material 202 for the first layer (see pot 3402) and the second layer (see pot 3400) are loaded into the cavity, the transfer system is triggered. Pistons or plungers 3708 as well as pellets 3706 with regard to the first mold material 202 and pellets 3704 with regard to the second mold material 204 are shown in FIG. 37 as well.

A first step transfer (as shown in FIG. 35) shows the mold flow of the inner mold material 202 (see pot 3402). Once compression is complete, the first layer material curing procedure is started and the second plunger system 3700, which carries the second mold material 204 (see pot 3400)

can move to the heating zone 3750 to perform preheating. After curing is done, the top cavity may move up together with a shuttle which is located at a second runner gate (see reference 3600). This allows the second runner path open to enable the second mold material 204 to be transferred to the mold cavity in order to form the second layer or structure of the molded package, as example for a molded body 200.

In a nutshell, FIG. 35 shows the first step transfer, in which the first mold material 202 is inserted into the mold volume(s) 106 by piston motion. FIG. 36 shows the second step transfer, in which the second mold material 204 is inserted into the mold volume(s) 106 by further piston motion. Curing of the first mold material 202 and/or extension of the dimension of the mold volume(s) 106 can be carried out in between the operation states shown in FIG. 35 and FIG. 36. The embodiment of FIG. 34 to FIG. 37 therefore relates to a transfer architecture in which two different mold materials 202, 204 are handled in one mold shot having the pellets 3704, 3706 for the two different mold materials 202, 204 in two different pots 3400, 3402.

Figure 38:
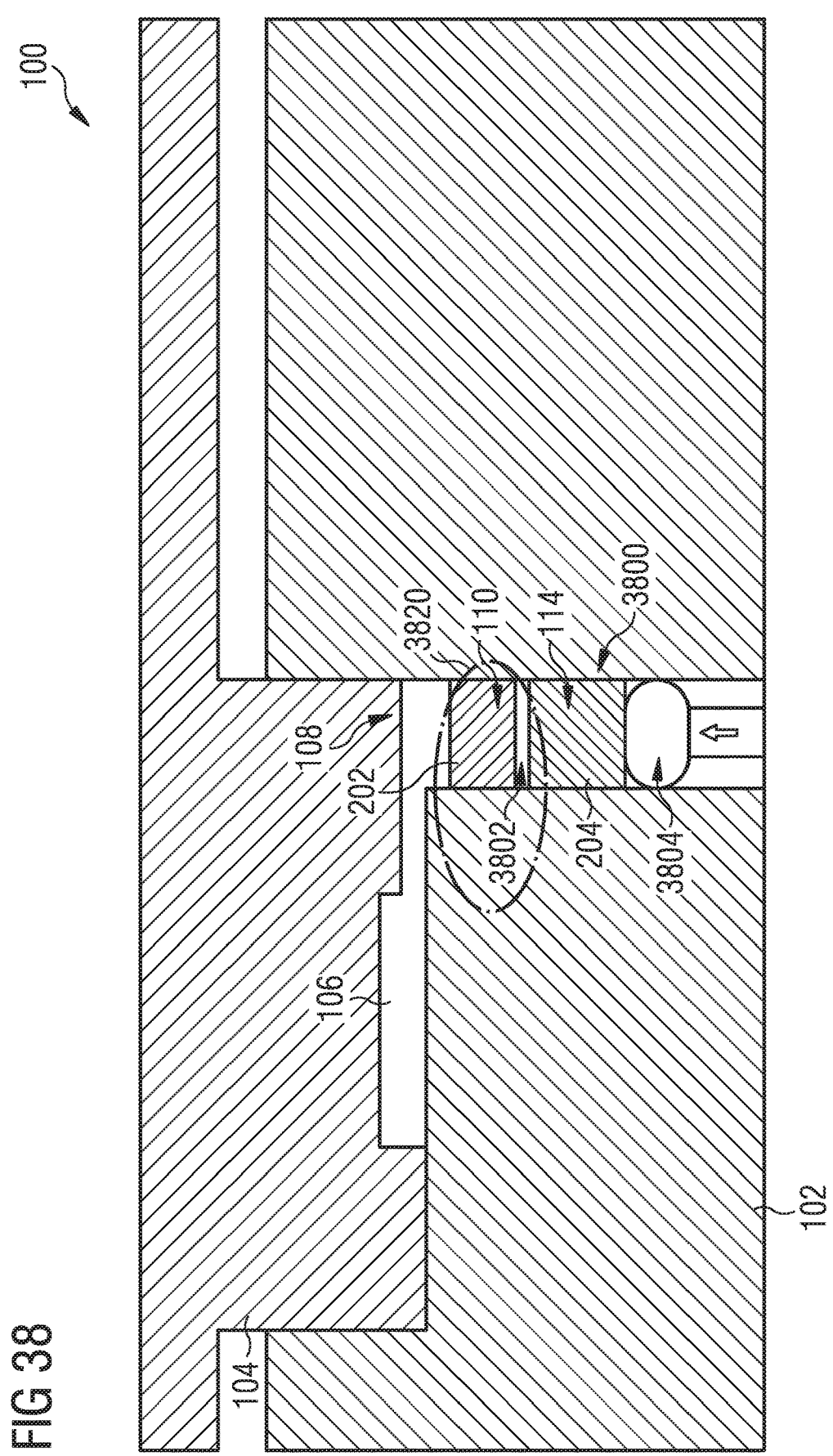
FIG. 38 illustrates a plan view of a part of a supply unit of a molding apparatus according to another exemplary embodiment in a first operation state.
Figure 39:
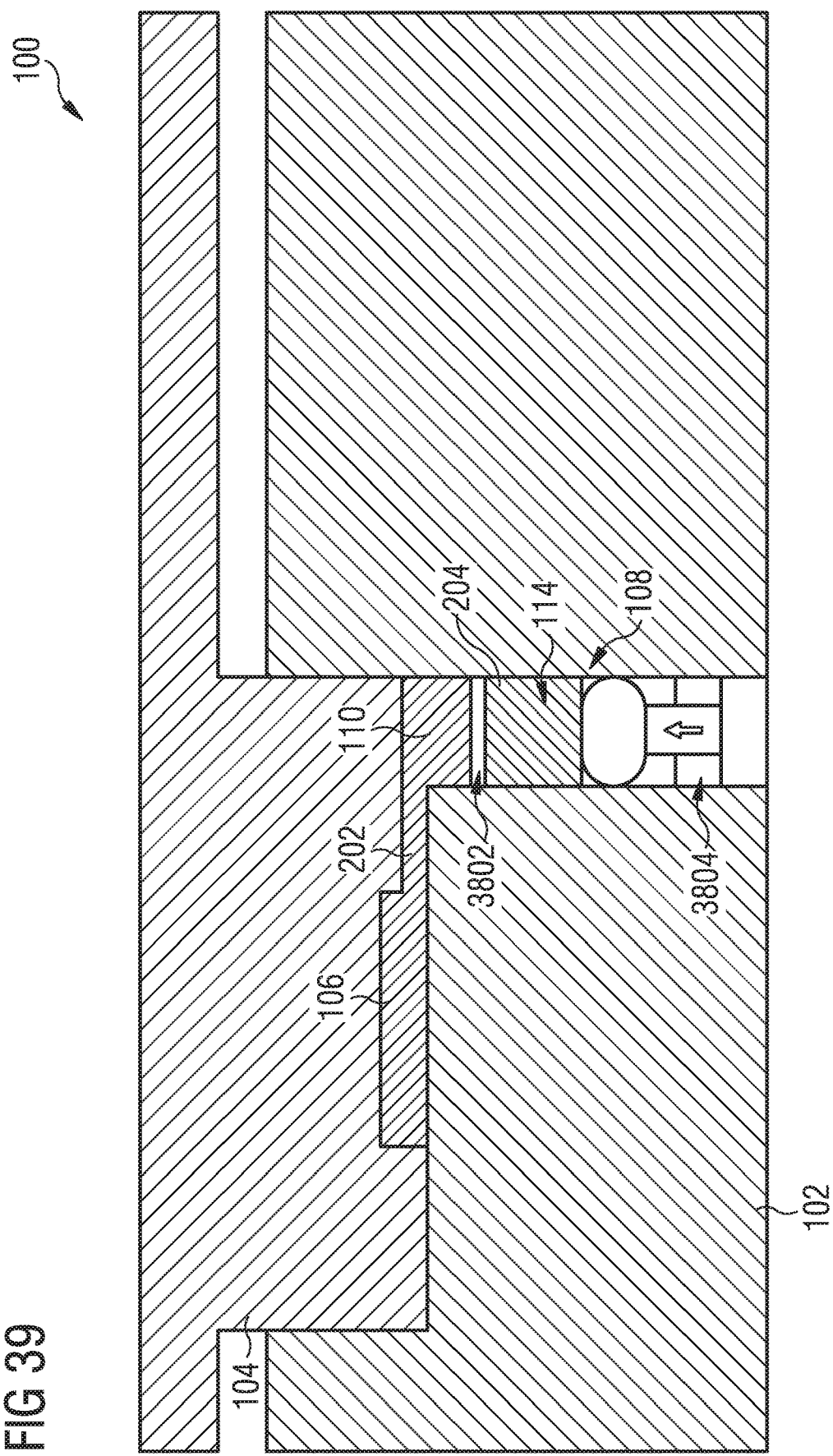
FIG. 39 illustrates a plan view of the supply unit according to FIG. 38 in a second operation state.
Figure 40:
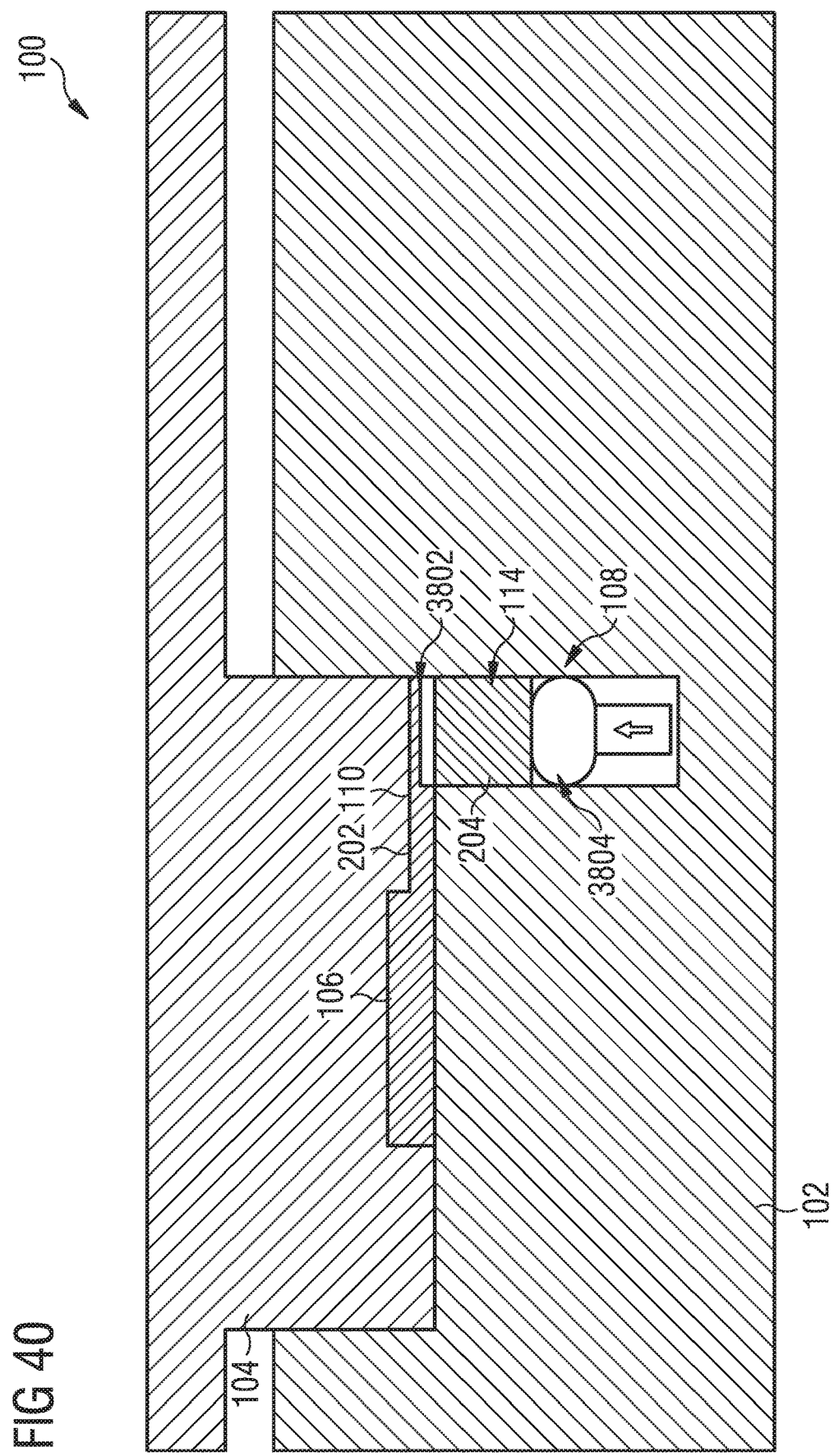
FIG. 40 illustrates a plan view of the supply unit according to FIG. 38 in a third operation state.

FIG. 38 illustrates a plan view of a part of a supply unit 108 of a molding apparatus 100 according to another exemplary embodiment in a first operation state. FIG. 39 illustrates a plan view of the supply unit 108 according to FIG. 38 in a second operation state after the first operation state. FIG. 40 illustrates a plan view of the supply unit 108 according to FIG. 38 in a third operation state after the second operation state. FIG. 41 illustrates a plan view of the supply unit 108 according to FIG. 38 in a fourth operation state after the third operation state.

Referring to the embodiment according to FIG. 38 to FIG. 41, the supply unit 108 comprises a common supply path 3800 for supplying both the first mold material 202 and—however spatially separated therefrom—the second mold material 204 to the mold volume 106. Consequently, the supply unit 108 is configured for simultaneously and nevertheless sequentially transporting a first volume of first mold material 202 followed by a second volume of second mold material 204 to the mold volume 106. More specifically, the supply unit 108 is configured for interposing a dummy spacer 3802 (such as a plastic element), which does not form part of the readily molded package, between the simultaneously transported first volume of first mold material 202 and second volume of second mold material 204. During operation, the supply unit 108 is configured for transporting the dummy spacer 3802, by a driving force of a plunger 3804, continuously along a straight first direction (upwardly according to FIG. 38), and is configured for transporting the first volume of first mold material 202 and the second volume of second mold material 204 along the first direction (compare vertical direction according to FIG. 38) until the first mold material 202 and the second mold material 204 reach the mold volume 106. Thereafter, the fluidic first mold material 202 and second mold material 204 may move along another second direction (compare horizontal direction according to FIG. 39) into the mold volume 106 when the first mold material 202 and the second mold material 204 have reached the vertical level of the mold volume 106. To carry out this procedure, the supply unit 108 comprises the movable plunger 3804 configured for moving the first mold material 202 and the second mold material 204 in an upward direction according to FIG. 38 and later pressing them in a sideward direction into the mold volume 106.

The embodiment according to FIG. 38 to FIG. 41 therefore shows an alternative way to transfer multiple materials in a single pot and plunger system within a single mold shot.

By using the dummy spacer 3802, it is possible to keep both the mold material 202 of the first encapsulation layer and the mold material 204 of the second encapsulation layer separate from one another along the supply paths 110, 114. The dummy spacer 3802 material can be thermoplastic rubber, polymer or metallic material, preferably with high temperature resistance. For a two material transfer molding apparatus 100, the first mold material 202 may be stacked on top of the second mold material 203 and separated by the dummy spacer 3802. During an initial stage when both mold materials 202, 204 drop to the pot, the upper first mold material 202 (referring to FIG. 38 the first layer mold material) will be in heating zone 3820 while the lower second mold material 204 (referring to FIG. 38 the second layer mold material) is not yet in the heating zone 3820. After preheating of the first mold material 202, plunger 3804 will start to transfer the first mold material 202 to the mold cavity or mold volume 106 and will, at the same time, transport the second mold material 204 to the heating zone 3820. During curing the first mold material 202, the second mold material 204 will be preheated in the heating zone 3820. Once the curing is done, top cull block and cavity (i.e. part of second mold tool 104) will move and plunger 3804 will continue to move, breaking the first mold material 202 cull and transferring the second mold material 204 to the cavity or mold volume 106. This will be followed by a curing process.

Thus, FIG. 38 to FIG. 41 show a side view of a mold chase assembly for a single pot and plunger system and shows how it can operate in supplying two different mold materials 202, 204 in a single mold cycle.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An apparatus for molding a physical body comprising at least two different mold materials, wherein the apparatus comprises:
    a first mold tool and a second mold tool configured for defining a mold volume in between in which the physical body is moldable by supplying the at least two different mold materials, wherein the different mold materials have different physical properties;
    a supply unit configured for separately supplying the at least two different mold materials to the mold volume one after the other;
    wherein at least part of at least one of the first mold tool and the second mold tool is movable to thereby increase the dimension of the mold volume after having supplied the first mold material to the mold volume and before and/or during supplying the second mold material to the mold volume.

2. The apparatus according to claim 1, wherein the first mold tool is stationary and the second mold tool is at least partially movable.

3. The apparatus according to claim 1, wherein the first mold tool is a bottom mold tool and the second mold tool is a top mold tool.

4. The apparatus according to claim 1, wherein the mold volume is delimited by a planar boundary surface of the first mold tool and a three-dimensionally profiled boundary surface of the second mold tool.

5. The apparatus according to claim 1, wherein at least part of at least one of the first mold tool and the second mold tool is movable to thereby increase the dimension of the mold volume in a stacking direction, in particular exclusively in a stacking direction, of the first mold tool and the second mold tool.

6. The apparatus according to claim 1, wherein the first mold tool and the second mold tool are configured so that despite of the motion, the dimension of the mold volume remains constant in a plane perpendicular to a stacking direction of the first mold tool and the second mold tool.

7. The apparatus according to claim 1, wherein the first mold tool and the second mold tool are configured so that the mold volume comprises a plurality of separate volume sections in fluid communication with one another, wherein a respective physical body is manufacturable in each of the volume sections, in particular by simultaneously supplying the respective mold material into at least two of the volume sections.

8. The apparatus according to claim 1, configured for manufacturing a semiconductor package as physical body.

9. The apparatus according to claim 1, wherein the supply unit comprises:
a first supply path configured for supplying the first mold material, in particular from a first reservoir, to the mold volume; and
a second supply path configured for supplying the second mold material, in particular from a second reservoir, to the mold volume with the increased dimension.

10. The apparatus according to claim 1, wherein the supply unit comprises a common supply path for supplying the first mold material and the second mold material to the mold volume.

11. The apparatus according to claim 10, wherein the supply unit is configured for simultaneously transporting a first volume of first mold material followed by a separate second volume of second mold material to the mold volume.

12. The apparatus according to claim 11, wherein the supply unit is configured for interposing a dummy spacer between the simultaneously transported first volume of first mold material and second volume of second mold material to thereby maintain the first volume of first mold material and the second volume of second mold material separate from one another upstream of the mold volume.

13. The apparatus according to claim 12, wherein the supply unit is configured for transporting the dummy spacer continuously along a first direction, and is configured for transporting the first volume of first mold material and the second volume of second mold material along the first direction until the first mold material and the second mold material reach the mold volume, and wherein the supply unit is configured for transporting the first volume of first mold material and the second volume of second mold material along another second direction into the mold volume when the first mold material and the second mold material have reached the mold volume.

14. The apparatus according to claim 1, wherein the supply unit comprises at least one movable plunger configured for moving at least one of the first mold material and the second mold material.

15. The apparatus according to claim 1, wherein at least part of at least one of the first mold tool and the second mold tool is configured to be further movable to thereby further increase the dimension of the increased mold volume after having supplied the second mold material to the increased mold volume and before and/or during supplying a third mold material to the further increased mold volume.

16. A method of manufacturing a physical body comprising at least two different mold materials by molding, wherein the method comprises:
defining an initial mold volume between a first mold tool and a second mold tool;
supplying a first mold material to the initial mold volume;
subsequently moving at least part of at least one of the first mold tool and the second mold tool to thereby change the dimension of the mold volume compared to the initial mold volume;
supplying the second mold material to the mold volume with the changed dimension during and/or after the moving, wherein the first mold material and the second mold material have different physical properties.

17. The method according to claim 16, wherein the method comprises manufacturing a semiconductor package as the physical body, wherein in particular the semiconductor package comprises at least one semiconductor chip which is at least partially encapsulated by the first mold material which is, in turn, at least partially encapsulated by the second mold material.

18. The method according to claim 17, wherein the first mold tool and the second mold tool are assembled to one another before supplying the first mold material to the mold volume, and are only disassembled from one another for taking the physical body out of the mold tools after supplying the second mold material to the mold volume.

* * * * *